United States Patent
Kim et al.

(10) Patent No.: US 10,905,019 B2
(45) Date of Patent: Jan. 26, 2021

(54) DISPLAY DEVICE

(71) Applicant: LG ELECTRONICS INC., Seoul (KR)

(72) Inventors: Hoyoung Kim, Seoul (KR); Kitae Kang, Seoul (KR); Dohyeon Kim, Seoul (KR); Changwan Noh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/748,123

(22) Filed: Jan. 21, 2020

(65) Prior Publication Data

US 2020/0163238 A1 May 21, 2020

Related U.S. Application Data

(63) Continuation of application No. 16/256,876, filed on Jan. 24, 2019, now Pat. No. 10,582,628, which is a
(Continued)

(30) Foreign Application Priority Data

Sep. 5, 2016 (KR) ........................ 10-2016-0113898

(51) Int. Cl.
*H05K 5/00* (2006.01)
*H05K 5/02* (2006.01)
(Continued)

(52) U.S. Cl.
CPC ......... *H05K 5/0217* (2013.01); *B21B 39/008* (2013.01); *G06F 1/1601* (2013.01);
(Continued)

(58) Field of Classification Search
None
See application file for complete search history.

(56) References Cited

U.S. PATENT DOCUMENTS 5,251,837 A 10/1993 Kammann et al.
9,625,946 B2 * 4/2017 Lee ........................ G06F 1/1652
(Continued)

FOREIGN PATENT DOCUMENTS

CN 1359077 A 7/2002
CN 100363960 C 1/2008
(Continued)

OTHER PUBLICATIONS

Continuation of U.S. Pat. No. 10,582,628.
Continuation of U.S. Pat. No. 10,201,103.

*Primary Examiner* — Courtney L Smith
*Assistant Examiner* — Rashen E Morrison
(74) *Attorney, Agent, or Firm* — Dentons US LLP

(57) ABSTRACT

A display device is disclosed. The display device includes a housing, a plurality of rollers positioned inside the housing, a display unit including a display panel and a module cover having at least one apron, of which at least a portion is connected to each other, and a driver including a motor assembly, an upper bar coupled to an upper part of the display unit, and at least one support portion having one side coupled to both ends of the upper bar and the other side coupled to the motor assembly and moving up and down the upper bar. The display panel and the module cover are in a first state in which they are wound around the roller or a second state in which they are unwound from the roller, contact each other, and are exposed to the outside of the housing.

19 Claims, 30 Drawing Sheets

Related U.S. Application Data continuation of application No. 15/690,928, filed on Aug. 30, 2017, now Pat. No. 10,201,103.

(51) Int. Cl.

| | |
|---|---|
| *G06F 1/16* | (2006.01) |
| *H04N 5/655* | (2006.01) |
| *G09F 9/30* | (2006.01) |
| *B21B 39/00* | (2006.01) |
| *H01L 51/00* | (2006.01) |
| *H01L 51/52* | (2006.01) |

(52) U.S. Cl.
CPC ............ *G06F 1/1652* (2013.01); *G09F 9/301* (2013.01); *H01L 51/0097* (2013.01); *H01L 51/5237* (2013.01); *H04N 5/655* (2013.01); *H05K 5/0017* (2013.01); *H05K 5/0247* (2013.01); *H01L 2251/5338* (2013.01)

(56) References Cited

U.S. PATENT DOCUMENTS

| | | | |
|---|---|---|---|
| 10,534,402 B1* | 1/2020 | Kim | ............ G09F 9/301 |
| 2004/0183958 A1* | 9/2004 | Akiyama | ............ G09F 9/30 |
| | | | 349/58 |
| 2006/0007368 A1* | 1/2006 | Slikkerveer | ............ G09F 11/29 |
| | | | 349/58 |
| 2007/0211036 A1 | 9/2007 | Perkins | |
| 2011/0043976 A1 | 2/2011 | Visser et al. | |
| 2012/0002357 A1* | 1/2012 | Auld | ............ G09F 21/04 |
| | | | 361/679.01 |
| 2013/0021762 A1 | 1/2013 | van Dijk et al. | |
| 2013/0285921 A1 | 10/2013 | Alberth, Jr. et al. | |
| 2014/0042293 A1 | 2/2014 | Mok et al. | |
| 2014/0104765 A1 | 4/2014 | Hoshino | |
| 2014/0247544 A1 | 9/2014 | Ryu | |
| 2016/0029474 A1 | 1/2016 | Cho et al. | |
| 2016/0187929 A1* | 6/2016 | Kim | ............ G06F 1/1601 |
| | | | 345/184 |
| 2017/0031387 A1 | 2/2017 | Kim | |
| 2017/0168769 A1* | 6/2017 | Jeon | ............ H04M 1/0268 |

FOREIGN PATENT DOCUMENTS

| | | |
|---|---|---|
| CN | 201435185 Y | 3/2010 |
| CN | 102446469 A | 5/2012 |
| CN | 105096743 A | 11/2015 |
| CN | 105741683 A | 7/2016 |
| KR | 1021050137216 A | 12/2015 |
| WO | 2018133510 A2 | 11/2008 |
| WO | 2016093502 A1 | 6/2016 |

\* cited by examiner (a)

(b)

DISPLAY DEVICE

This application is a continuation of U.S. patent application Ser. No. 16/256,876, filed Jan. 24, 2019, now allowed, which is a continuation of U.S. patent application Ser. No. 15/690,928, filed Aug. 30, 2017, now U.S. Pat. No. 10,201,103, which claims the benefit of Korean Patent Application No. 10-2016-0113898 filed on Sep. 5, 2016, the entire contents of which are incorporated herein by reference for all purposes as if fully set forth herein.

BACKGROUND OF THE INVENTION

Field of the Invention

The present disclosure relates to a display device.

Discussion of the Related Art

With the development of the information society, various demands for display devices are increasing. Various display devices, such as liquid crystal displays (LCDs), plasma display panels (PDPs), electroluminescent displays (ELDs), and vacuum fluorescent displays (VFDs), have been recently studied and used in response to the various demands for the display devices.

A display device using an organic light emitting diode (OLED) is advantageous in that it has better luminance characteristic and viewing angle characteristic than a liquid crystal display, and has a ultra-thin profile because it does not require a backlight unit unlike the liquid crystal display.

SUMMARY OF THE INVENTION

In one aspect, there is provided a display device including a housing, a plurality of rollers positioned inside the housing, a display unit including a display panel and a module cover having at least one apron, of which at least a portion is connected to each other, and a driver including a motor assembly, an upper bar coupled to an upper part of the display unit, and at least one support portion having one side coupled to both ends of the upper bar and the other side coupled to the motor assembly and moving up and down the upper bar, wherein the display panel and the module cover are in a first state in which they are wound on the roller or a second state in which they are unwound from the roller, contact each other, and are exposed to the outside of the housing, and wherein the plurality of rollers includes a panel roller winding and unwinding the display unit and an auxiliary roller that is positioned adjacent to the panel roller and moves to wind and unwind in a direction opposite to the panel roller.

The display device may further include a protective sheet positioned inside the housing and contacting the display panel while the auxiliary roller is released.

One end of the protective sheet may be connected to the auxiliary roller, and the other end of the protective sheet may be connected to one end of the display panel.

The protective sheet may include a nonwoven fabric.

The auxiliary roller may include a fixed cap fixed to one end of the auxiliary roller, a rotating cap positioned at the other end of the auxiliary roller and being rotatable, and a coil spring of which both ends are connected to the fixed cap and the rotating cap.

When the first state is changed to the second state, one end of the coil spring connected to the fixed cap may be fixed, and the other end of the coil spring connected to the rotating cap may be wound while rotating.

When the first state is changed to the second state, a position of the auxiliary roller may change.

A front surface of the display panel may be closer to the auxiliary roller in the first state than the auxiliary roller in the second state.

The auxiliary roller may move along a rail formed inside the housing.

The display device may further include a guide assembly coupled to the auxiliary roller.

The guide assembly may guide the auxiliary roller to move toward a front surface of the display panel.

The guide assembly may include a guide arm of which one end is connected to the auxiliary roller, and a tension spring of which one end is connected to the other end of the guide arm.

As the auxiliary roller moves, the guide arm may rotate.

As the auxiliary roller is away from a front surface of the display panel, the guide arm may rotate in a counterclockwise direction.

As the guide arm rotates, a length of the tension spring may change.

As the auxiliary roller is away from a front surface of the display panel, the length of the tension spring may increase.

The guide assembly may further include a pin bolt that is positioned in the center of the guide arm and fixes the guide arm to the housing.

An extending direction of the guide arm may change with respect to the pin bolt.

When the first state is changed to the second state, the guide arm may rotate around the pin bolt.

The guide assembly may further include a supporter that is connected to the other end of the tension spring and is fixed to the housing.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 18A, 18B to 29 illustrate a display device according to an embodiment of the invention.

DETAILED DESCRIPTION OP THE EMBODIMENTS

Figure 1:
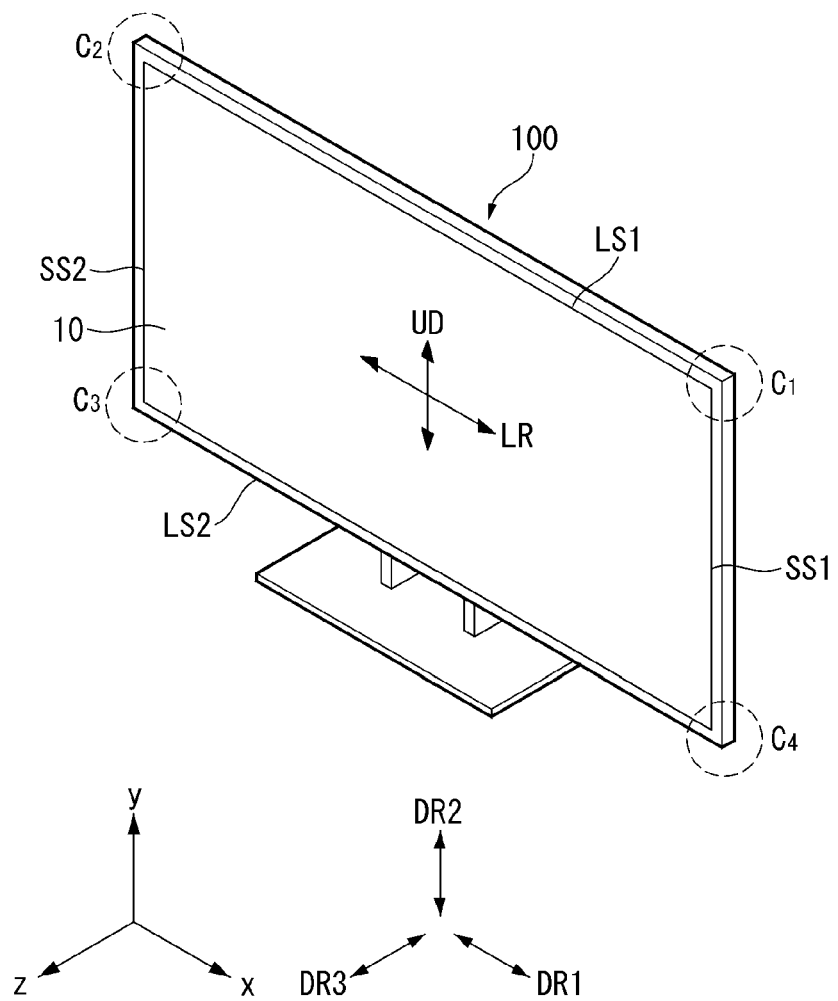
FIGS. 1 to 17 illustrate configuration of a display device related to an embodiment of the invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the invention are provided to those skilled in the art in order to describe the present invention more completely. Accordingly, shapes and sizes of elements shown in the drawings may be exaggerated for clarity.

Hereinafter, embodiments of the invention are described using an organic light emitting diode (OLED) display panel as an example of a display panel. Embodiments of the invention are not limited thereto. Other display panels may be used. For example, a plasma display panel (PDP), a field emission display (FED) panel, and a liquid crystal display panel may be used.

FIGS. 1 to 17 illustrate configuration of a display device related to an embodiment of the invention.

As shown in FIG. 1, in the following description, a display panel 10 may include a first long side LS1, a second long side LS2 opposite the first long side LS1, a first short side SS1 adjacent to the first long side LS1 and the second long side LS2, and a second short side SS2 opposite the first short side SS1.

In embodiments disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

Embodiments of the invention describe that lengths of the first and second long sides LS1 and LS2 are longer than lengths of the first and second short sides SS1 and SS2 for the sake of brevity and ease of reading. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display panel 10, and a second direction DR2 may be a direction parallel to the short sides SS1 and SS2 of the display panel 10.

A third direction DR3 may be a direction vertical to the first direction DR1 and/or the second direction DR2.

In embodiments disclosed herein, the first direction DR1 and the second direction DR2 may be commonly referred to as a horizontal direction. Further, the third direction DR3 may be referred to as a vertical direction.

In addition, a side or a surface, on which a display device 100 displays an image, may be referred to as a front side or a front surface. When the display device 100 displays the image, a side or a surface, at which the image cannot be observed, may be referred to as a back side or a back surface. When the display device 100 is observed at the front side or the front surface, the first long side LS1 may be referred to as an upper side or an upper surface. In the same manner as the first long side LS1, the second long side LS2 may be referred to as a lower side or a lower surface. Further, the first short side SS1 may be referred to as a left side or a left surface, and the second short side SS2 may be referred to as a right side or a right surface.

Further, the first long side LS1, the second long side LS2, the first short side SS1, and the second short side SS2 may be referred to as edges of the display device 100. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In embodiments disclosed herein, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

Figure 2:
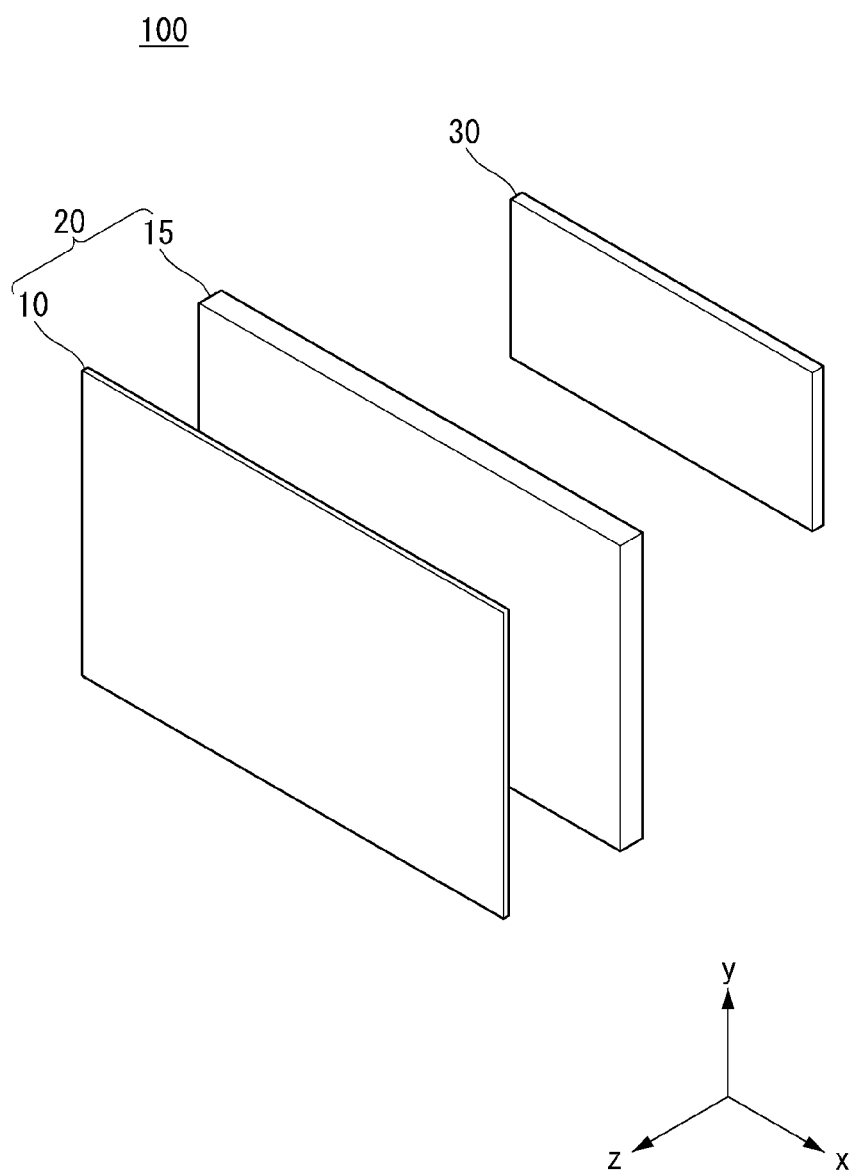

Referring to FIG. 2, the display device 100 according to the embodiment of the invention may include a display unit 20 and a housing 30.

The display unit 20 may include the display panel 10 and a module cover 15. The display panel 10 may be provided on a front surface of the display device 100 and may display an image. The display panel 10 may divide an image into a plurality of pixels and output the image by controlling the light emission in accordance with color, brightness, and chroma of each pixel. The display panel 10 may be divided into an active area, in which an image is displayed, and an inactive area, in which no image is displayed.

The display panel 10 may have a rectangular shape. However, embodiments of the invention are not limited thereto. For example, the display panel 10 may have a shape in which an edge has a predetermined curvature. The display panel 10 may be an OLED display panel. Other display panels may be used. For example, a liquid crystal display panel may be used.

The module cover 15 may be provided on a back surface of the display panel 10. The module cover 15 may be directly attached to the display panel 10. A size of the module cover 15 may be equal to or greater than a size of the display panel 10.

The module cover 15 may support the back surface of the display panel 10. Hence, the module cover 15 may include a lightweight material with high rigidity. For example, the module cover 15 may include aluminum.

The housing 30 may be provided on a back surface of the display unit 20. Namely, the housing 30 may be provided on a back surface of the module cover 15. The housing 30 may shield at least one printed circuit board (PCB). Namely, the housing 30 may cover at least one PCB attached to the back surface of the module cover 15. A detailed coupling structure and a coupling method of at least one PCB are described below.

The housing 30 may receive electromagnetic waves emitted from at least one PCB. Hence, although not shown, the sing 30 may include an inner housing made of a conductive material and an outer housing covering the inner housing. However, embodiments of the invention are not limited thereto. For example, the housing 30 may be configured as one body made of a conductive material.

Figure 3:
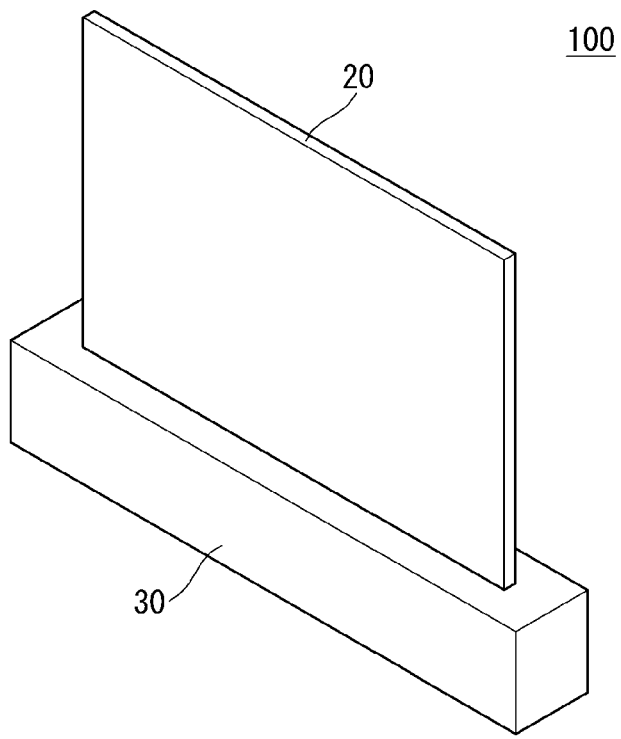

Referring to FIG. 3, in the display device 100 according to the embodiment of the invention, the housing 30 may be positioned under the display unit 20. More specifically, the housing 30 may have a shape surrounding a lower part of the display unit 20. Namely, the housing 30 may be configured not to expose various driving devices or driving circuits positioned inside the housing 30 to the outside.

A width of the housing 30 in the first and third directions may be greater than a width of the display unit 20 in the first and third directions in order to protect the display unit 20 therein. A width of the housing 30 in the second direction may be less than a width of the display unit 20 in the second direction because the housing 30 interferes with the view of a user.

The housing 30 may not be positioned in the active area of the display unit 20. Hence, the users can be immersed in the screen of the thinner display unit 20.

Figure 4:
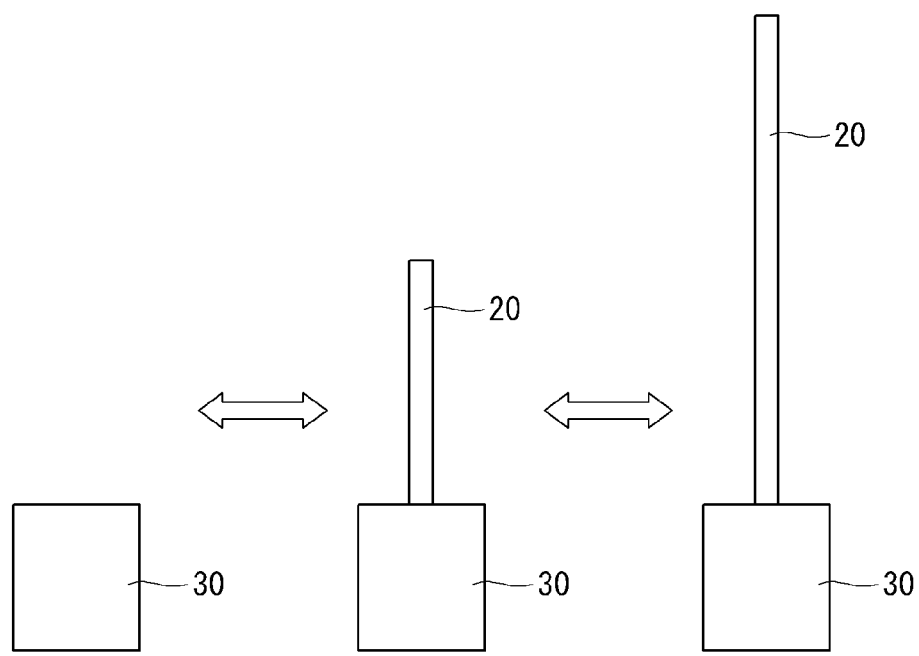

Referring to FIG. 4, the display device 100 according to the embodiment of the invention may be in a first state, in which the active area of the display unit 20 is positioned inside the housing 30, or a second state in which the active area of the display unit 20 is exposed to the outside of the housing 30.

When the display device 100 is in the first state, the active area of the display unit 20 may be positioned inside the housing 30. Namely, the display unit 20 may be shielded by the housing 30 in the first state.

When the display device 100 is in the second state, the active area of the display unit 20 may be exposed to the outside of the housing 30. Namely, at least a portion of the display unit 20 may protrude to an upper part of the housing 30 in the second state.

Although not shown, the display unit 20 may change from the first state to the second state by a roller positioned inside the housing 30. More specifically, the display unit 20 may change from the first state, in which the display unit 20 is wound by the roller, to the second state in which the display unit 20 is unwound by the roller and is exposed to the outside. On the contrary, the display unit 20 may change from the second state to the first state when the display unit 20 is wound by the roller. A structure and an operation method of the roller and the display unit 20 are described in detail below.

The display unit 20 of the display device 100 according to the embodiment of the invention may be in the first state or the second state. Thus, the user can expose the display unit 20 to the outside of the housing 30 only when viewing the display device 100, thereby saving space.

Figure 5:
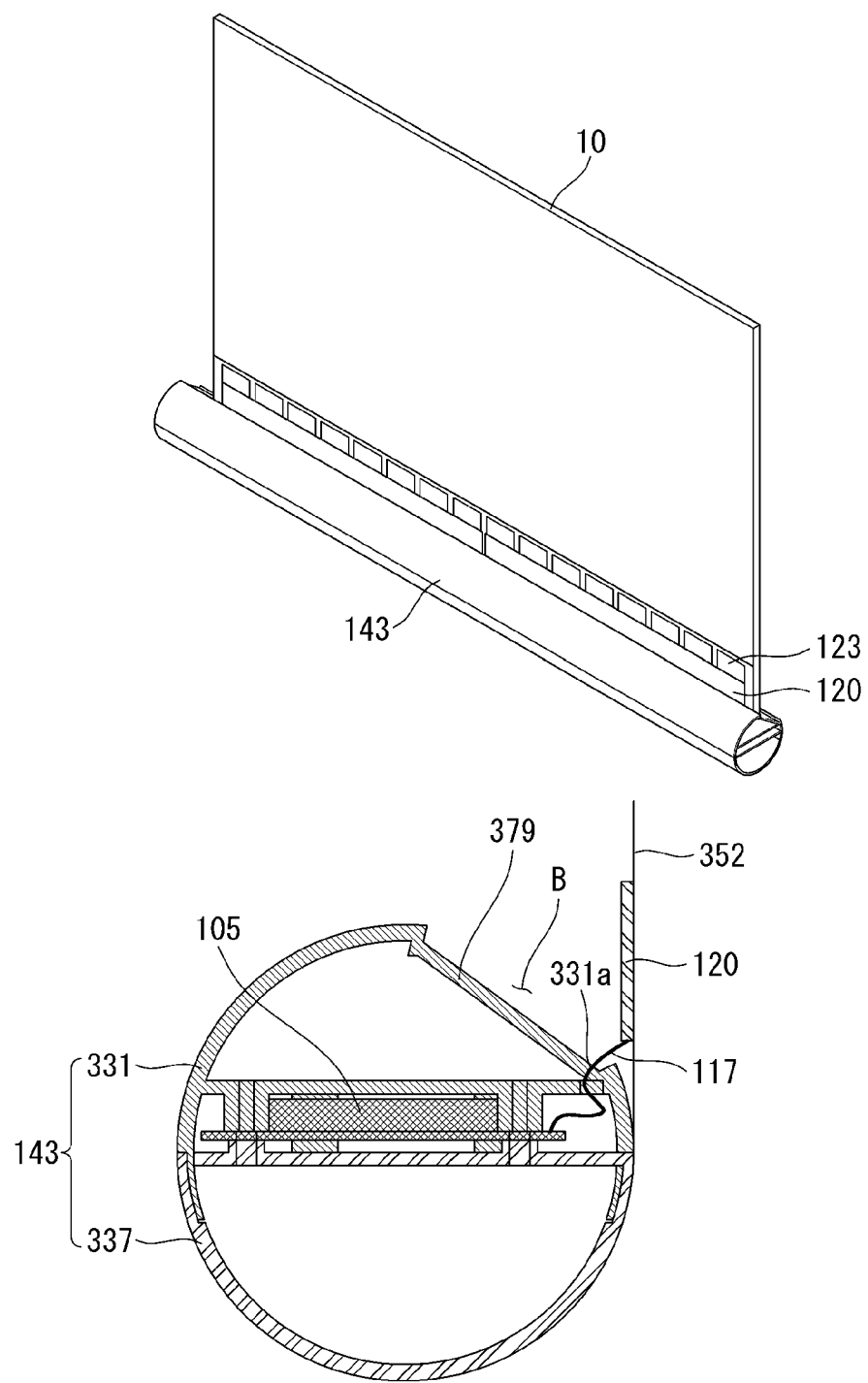

Referring to FIG. 5, a panel roller 143 may be connected to one end of the display panel 10. The panel roller 143 may wind or unwind the display panel 10 so that the display panel 10 is in the first state or the second state.

In the display device according to the embodiment of the invention, at least one source PCB 120 may be positioned on at least a portion of a front surface of the display panel 10. For example, a plurality of source PCBs 120 may be positioned to be spaced apart from one another.

Signal lines may be positioned on at least one source PCB 120 and may transmit digital video data and timing control signals received from a timing controller board 105. The source PCB 120 may be connected to the display panel 10 by a source chip-on film (COF) 123. The source COF 123 connected to one side of the source PCB 120 may be extended to the active area of the display panel 10 and connected to the display panel 10.

A seating portion 379 may be positioned on the outer periphery of the panel roller 143. The seating portion 379 may form an accommodation space B by stepping a portion of the outer periphery of the panel roller 143. The seating portion 379 may be positioned at a contact portion between the source PCB 120 and the panel roller 143 when the panel roller 143 is wound or released. The seating portion 379 may have a shape in which at least a portion of the outer periphery of the panel roller 143 is depressed.

When the panel roller 143 is wound, the source PCB 120 may be placed in the seating portion 379, and at least a portion of the source PCB 120 may contact the panel roller 143. Hence, even when the panel roller 143 is wound, the source PCB 120 may not be damaged.

The timing controller board 105 may be mounted inside the panel roller 143. A flexible flat cable (FFC) 117 connected to the source PCB 120 can be prevented from being twisted by mounting the timing controller board 105 inside the panel roller 143.

The panel roller 143 may include an upper panel roller 331 and a lower panel roller 337. The upper panel roller 331 and the lower panel roller 337 may be coupled to each other by at least one screw. The timing controller board 105 may be mounted between the upper panel roller 331 and the lower panel roller 337. At least one screw may couple the upper panel roller 331 to the lower panel roller 337 and also couple them to the timing controller board 105. The FFC 117 may be connected to the timing controller board 105 and the source PCB 120 through a hole 331a positioned in the upper panel roller 331.

Because the timing controller board 105 rotates together with the panel roller 143, the FFC 117 may be coupled to the timing controller board 105 and the source PCB 120 without being twisted. Further, space can be saved because the timing controller board 105 is mounted inside the panel roller 143.

Figure 6:
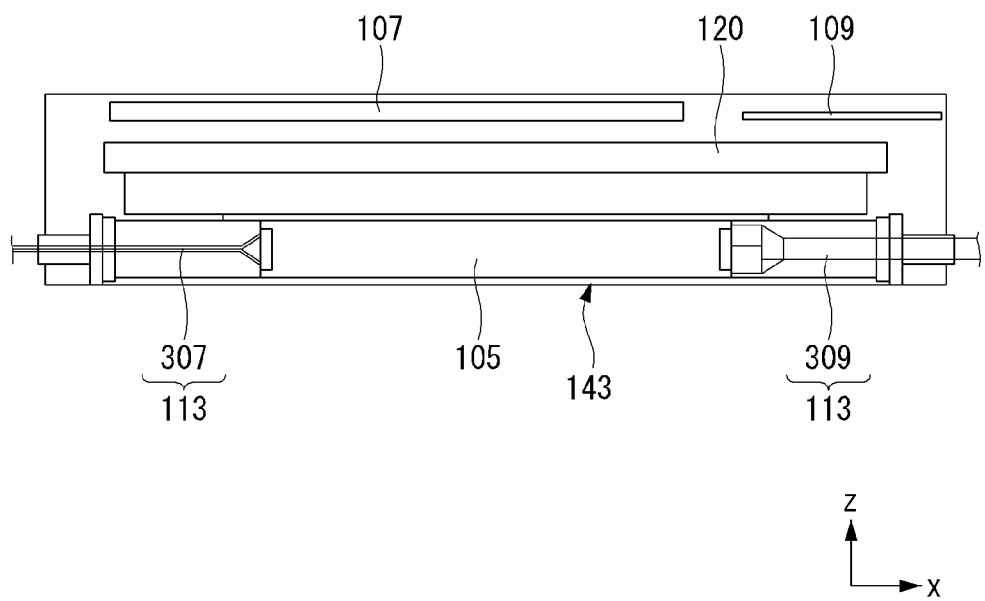

Referring to FIG. 6, the timing controller board 105 may be mounted inside the panel roller 143 at one side of the housing 30 with respect to the center of the housing 30 in which the display panel moves up and down, and a power supply board 107 and a main hoard 109 may be positioned at the other side of the housing 30.

The timing controller board 105 may be connected to the power supply board 107 and the main board 109. The timing controller board 105 may be connected to the power supply board 107 and the main board 109 through a wiring electrode 113. More specifically, the wiring electrode 113 may include a first wiring electrode 307 connecting the timing controller board 105 to the power supply hoard 107 and a second wiring electrode 309 connecting the timing controller board 105 to the main board 109.

For example, a plurality of first wiring electrodes 307 may be disposed. The first wiring electrode 307 may have a circular shape. The first wiring electrode 307 may connect the timing controller board 105 to the power supply 107 through an opening in the center of a rotation axis of the panel roller 143.

The second wiring electrode 309 may use the FFC 117 connected to the timing controller board 105 and the source PCB 120. The second wiring electrode 309 may connect the timing controller board 105 to the main hoard 109 through an opening in the center of the rotation axis of the panel roller 143.

The first wiring electrode 307 and the second wiring electrode 309 may be positioned on the opposite sides of the timing controller board 105. The openings of the first wiring electrode 307 and the second wiring electrode 309 may be positioned on the opposite sides of the timing controller board 105.

In the display device according to the embodiment of the invention, the timing controller board 105 may be mounted on the panel roller 143, and the power supply board 107 and the main hoard 109 may be positioned on the opposite side of the display panel. Hence, an inner space of the housing 30 can be considerably saved.

Figure 7:
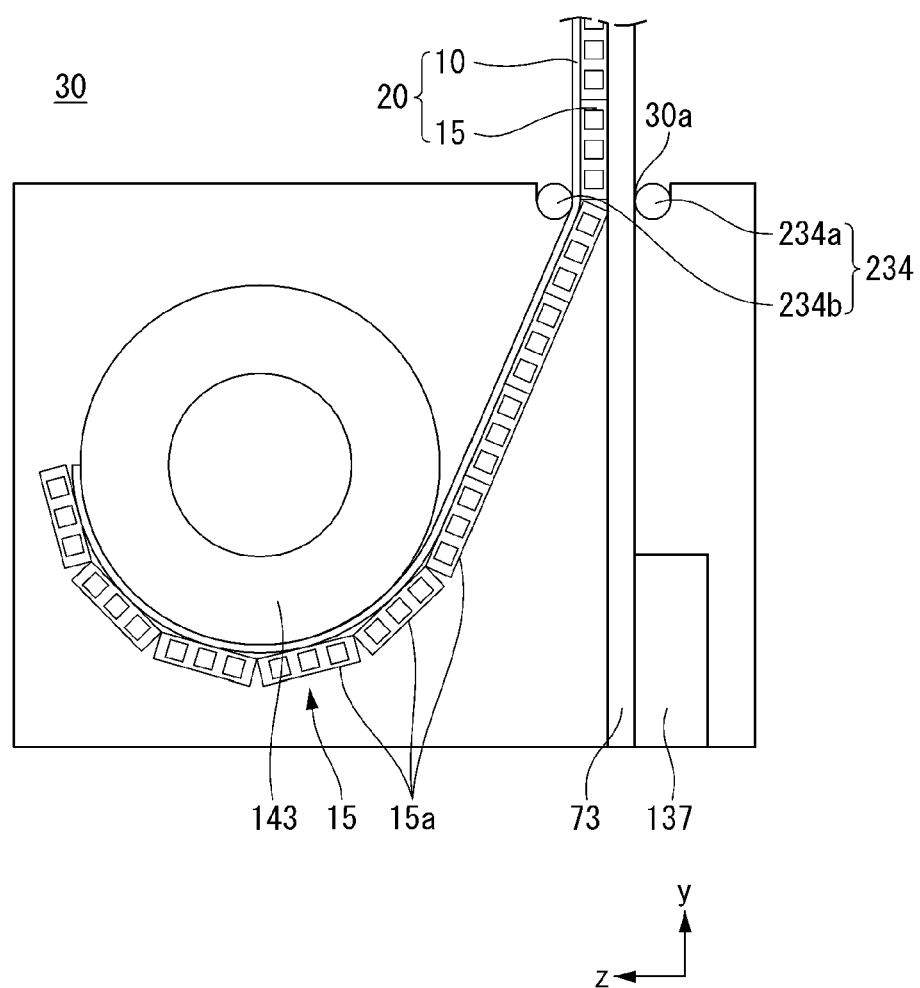

Referring to FIG. 7, the display device according to the embodiment of the invention may include the panel roller 143, a motor assembly 137, and a support portion 73 inside the housing 30.

The panel roller 143 may be positioned in front of a portion of the housing 30 in which the display unit 20 moves up and down. The panel roller 143 may simultaneously wind and unwind the display panel 10 and the module cover 15. Because the module cover 15 is thick, a diameter of the panel roller 143 may greatly increase when the display unit 20 changes from the second state to the first state. Thus, the panel roller 143 may be spaced apart from each surface of the housing 30 by a predetermined distance or more.

The support portion 73 may be positioned at a portion in which the display unit 20 moves up and down. The support portion 73 may function to support the display panel 10 and the module cover 15 so that they can move up and down. More specifically, the support portion 73 may move up and down an upper bar (not shown) coupled to the upper parts of the module cover 15 and the display panel 10. A driving method of the support portion 73 is described in detail below.

Because only the upper parts of the module cover 15 and the display panel 10 are connected to the upper bar, other parts may easily bend. Thus, the support portion 73 may support the module cover 15 so that the module cover 15 does not bend at the hack surface of the module cover 15. Because the support portion 73 continues to move when the display unit 20 changes from the first state to the second state, the support portion 73 may not be coupled to the module cover 15, but may support the module cover 15.

The motor assembly 137 may be positioned at a portion to which the support portion 73 is connected. The motor assembly 137 may drive the support portion 73 so that the support portion 73 moves up or down. The motor assembly 137 may receive an electrical signal and may convert the electrical signal into a physical force. The motor assembly 137 may transfer rotational energy to the support portion 73 and change the display unit 20 from the first state to the second state. A structure and a driving principle of the motor assembly 137 are described in detail below.

The display device according to the embodiment of the invention can simultaneously wind and unwind the display panel 10 and the module cover 15 using one roller. Hence, the user can enjoy the screen better by a reduction in a thickness of the housing 30.

Figure 8:
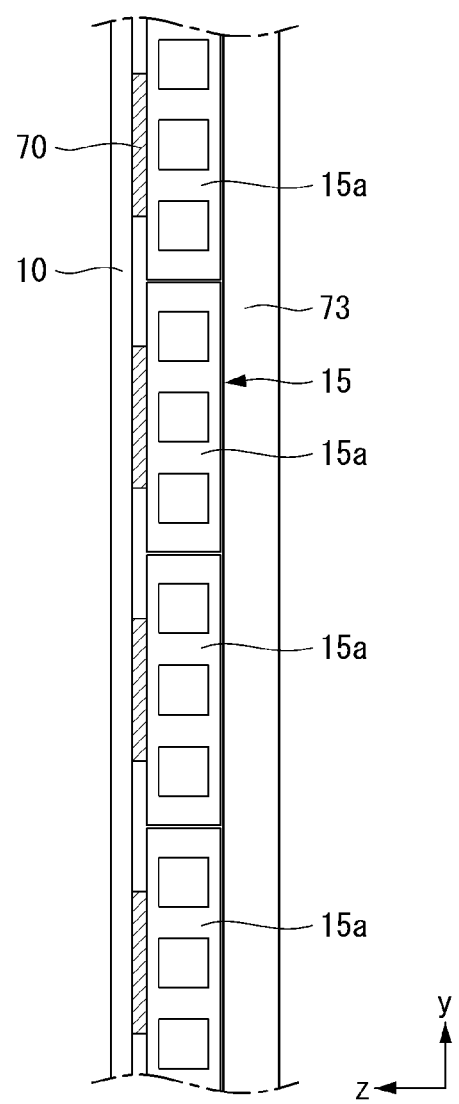

Referring to FIG. 8, the module cover 15 may include a plurality of aprons 15a. The apron may have a rectangular shape. The aprons 15a may be spaced apart from one another and attached to the back surface of the display panel 10. Because the module cover 15 includes the plurality of aprons 15a, a shape of the module cover 15 may be easily changed when the module cover 15 is wound or unwound by the roller. The module cover 15 may include a plastic material or an aluminum material. Hence, the module cover 15 may protect the display panel 10 from an external impact.

The display panel 10 and the module cover 15 may be coupled to each other through adhesive layers 70. The adhesive layer 70 may be a double-sided tape. The display panel 10 and the module cover 15 may be wound or unwound together by the adhesive layers 70. The adhesive layer 70 may be positioned on each apron and attached to the display panel 10. The adhesive layers 70 may be spaced apart from one another. Hence, the shape of the module cover 15 may be easily charmed when the module cover 15 is wound or unwound by the roller. As a width of the adhesive layer 70 in the second direction decreases, the deformation of the display panel 10 against an external force may decrease. More specifically, as the width of the adhesive layer 70 in the second direction decreases, the external force transferred to the display panel 10 may decrease because the flexibility of the display panel 10 is improved.

As a width of the apron in the second direction increases, a crack may not be formed on the display panel 10. More specifically, as the width of the apron in the second direction increases, the crack may not be formed on the display panel 10 because rigidity of the display panel 10 is improved.

Hence, when the width of the adhesive layer 70 in the second direction is equal to or less than 30% of the width of the apron in the second direction, the display screen may be less uneven because the external force transferred to the display panel 10 decreases.

Further, when the width of the adhesive layer 70 in the second direction is equal to or greater than 15% of the width of the apron in the second direction, the display panel 10 may have less cracks because the rigidity of the display panel 10 is improved.

As a width of the adhesive layer 70 in the third direction increases, the deformation of the display panel 10 against an external force may decrease. More specifically, as the width of the adhesive layer 70 in the third direction increases, the external force transferred to the display panel 10 may decrease because the flexibility of the display panel 10 is improved.

Further, as a width of the apron in the third direction decreases, a crack may not be formed on the display panel 10. More specifically, as the width of the apron in the third direction decreases, the crack may not be formed on the display panel 10 because the rigidity of the display panel 10 is improved.

Hence, when the width of the adhesive layer 70 in the third direction is equal to or greater than 3% of the width of the apron in the third direction, the display screen may be less uneven because the external force transferred to the display panel 10 decreases.

Further, when the width of the adhesive layer 70 in the third direction is equal to or less than 6% of the width of the apron in the third direction, the display panel 10 may have less cracks because the rigidity of the display panel 10 is improved.

In the display device according to the embodiment of the invention, the module cover 15 may include the plurality of aprons 15a, and the adhesive layer 70 may be positioned on each apron. Hence, when the module cover 15 is wound on the roller, the shape of the module cover 15 having the above-described configuration may be more easily changed than when the module cover 15 is configured as one body.

Figure 9A:
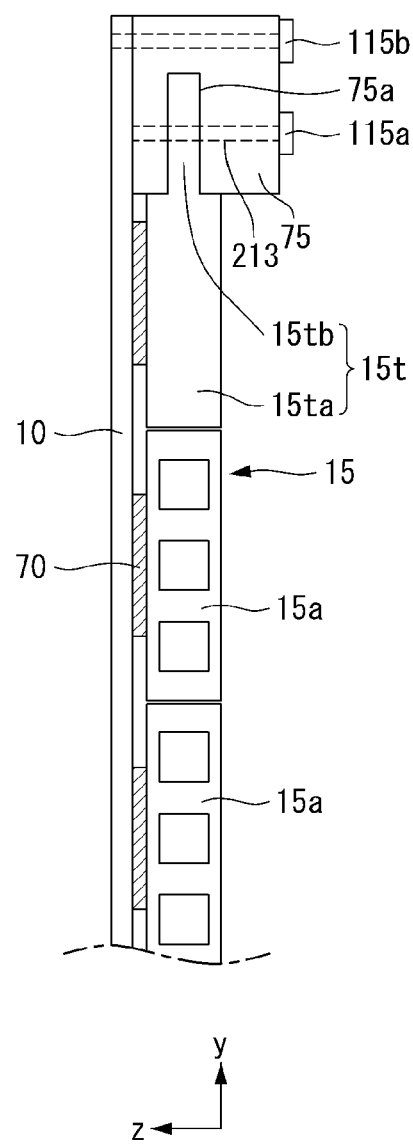

Referring to FIG. 9A, the module cover 15 and the display panel 10 may be fastened to an upper bar 75. More specifically, the module cover 15 and the display panel 10 may be fastened to the upper bar 75 by at least one screw 115.

When the upper bar 75 moves up and down, at least one screw 115 can prevent the module cover 15 and the display panel 10 from being detached from the upper bar 75 and allow the module cover 15 and the display panel 10 to move up and down together with the upper bar 75. At least one screw 115 may fasten the upper bar 75 to the module cover 15, and at least one screw 115 may fasten the upper bar 75 to the display panel 10. However, embodiments of the invention are not limited thereto. For example, at least one screw 115 may fasten the upper bar 75 to the module cover 15 and the display panel 10 together.

In order to couple the module cover 15 to the upper bar 75, an upper module cover 15t may have a different shape from other portions of the module cover 15. The upper module cover 15t may be an uppermost apron positioned at the top. More specifically, the uppermost apron may have a different shape from that of other aprons 15a. A thickness of at least a portion of the upper module cover 15t in the third direction may be different from that of another portion of the upper module cover 15t in the third direction. The at least a portion of the upper module cover 15t having a different thickness may be inserted into a groove of the upper bar 75.

The at least a portion of the upper module cover 15t having the different thickness may be fastened to the upper bar 75 through at least one screw 115. Because the at least a portion of the upper module cover 15t is inserted into the groove of the upper bar 75, the module cover 15 can be more strongly fastened to the upper bar 75.

Figure 9B:
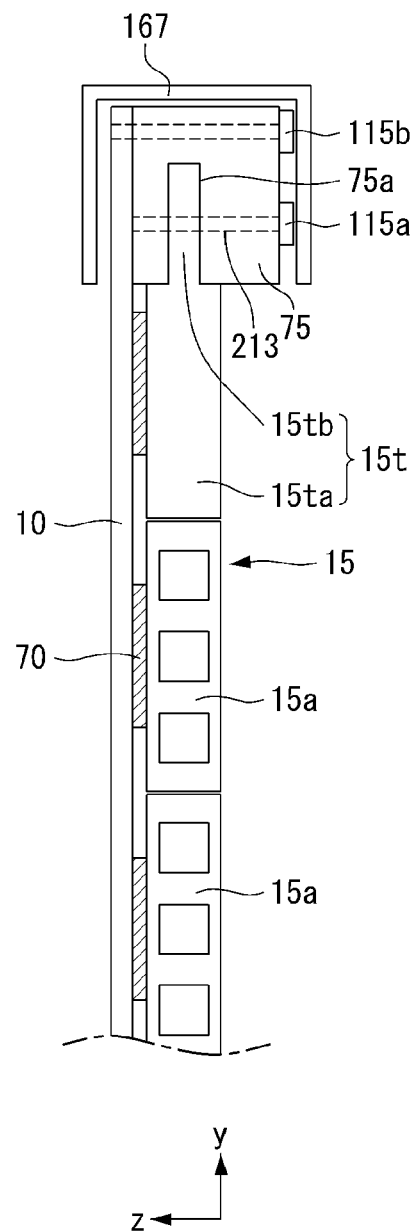

As shown in FIG. 9B, a top case 167 may cover the upper bar 75, the module cover 15, and the display panel 10. The top case 167 may shield an upper part and both sides of each of the upper bar 75, the module cover 15, and the display panel 10. At least one screw 115 may fasten the top case 167 to the upper bar 75, the module cover 15, and the display panel 10 together.

In the display device according to the embodiment of the invention, the upper bar 75 may be coupled to the module cover 15 and the display panel 10. Hence, the module cover 15 and the display panel 10 can be prevented from being detached from the upper bar 75 and easily move up and down.

Further, in the display device according to the embodiment of the invention, the top case 167 may cover the upper bar 75, the module cover 15, and the display panel 10. Hence, the user can feel that the display device has a neater appearance.

Figure 10:
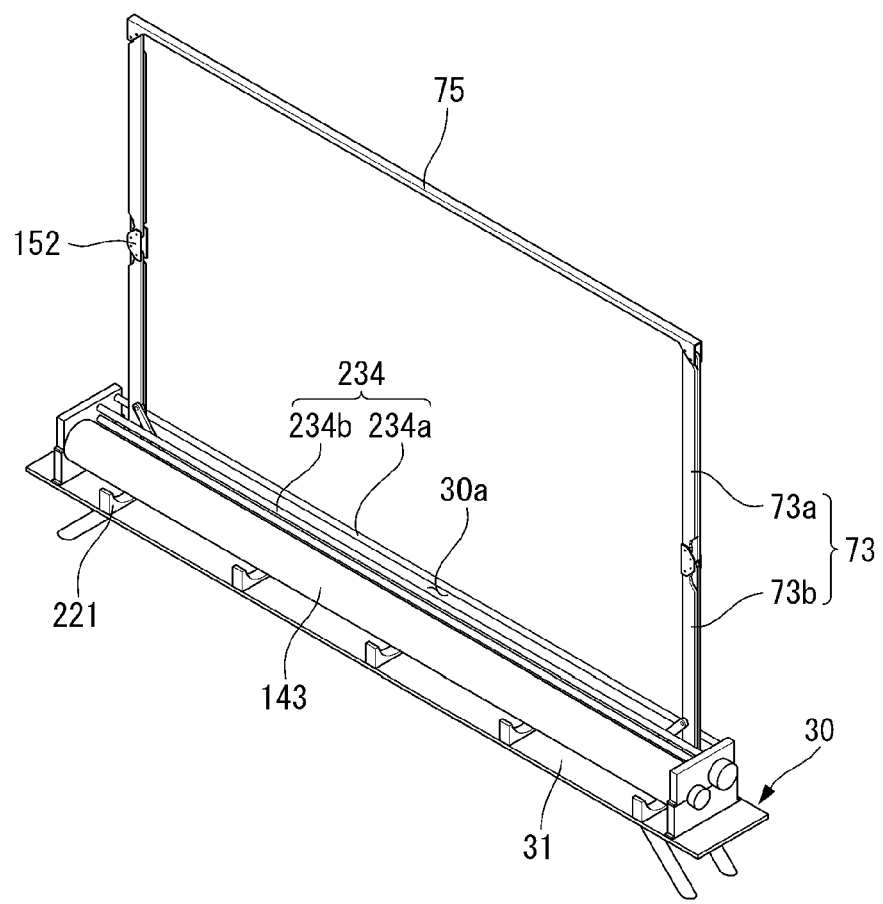

Referring to FIG. 10, the display device according to the embodiment of the invention may be in a shape in which both sides of the upper bar 75 are supported by the support portion 73. The upper bar 75 may be moved up and down by the support portion 73. The support portion 73 may include an upper link 73a and a lower link 73b.

The upper link 73a and the lower link 73b may be connected to each other by a hinge 152. One end of the upper link 73a may be fastened to the upper bar 75, and the other end may be fastened to the hinge 152. One end of the lower link 73b may be fastened to the motor assembly 137, and the other end may be fastened to the hinge 152.

A guide bar 234 may be positioned at an entrance where the support portion 73 enters and exits the inside of the housing 30 while moving up and down. The guide bar 234 may include first and second guide bars 234a and 234b. The first and second guide bars 234a and 234b may face each other with the support portion 73 interposed between them. For example, the first guide bar 234a may be positioned in front of the support portion 73, and the second guide bar 234b may be positioned in the rear of the support portion 73.

The panel roller 143 may be positioned at a front lower end of the support portion 73. At least one bracket 221 may be positioned on a portion of a bottom surface of the housing 30 corresponding to the panel roller 143. Namely, at least one bracket 221 may be positioned under the panel roller 143. The brackets 221 may be spaced apart from one another. At least one bracket 221 may be fixed to the bottom surface of the housing 30 through a screw.

The display device according to the embodiment of the invention may include various structures for the drive therein. Thus, even if the display panel is moved up and down by the roller, the risk of failure of the display device can be reduced.

Figure 11:
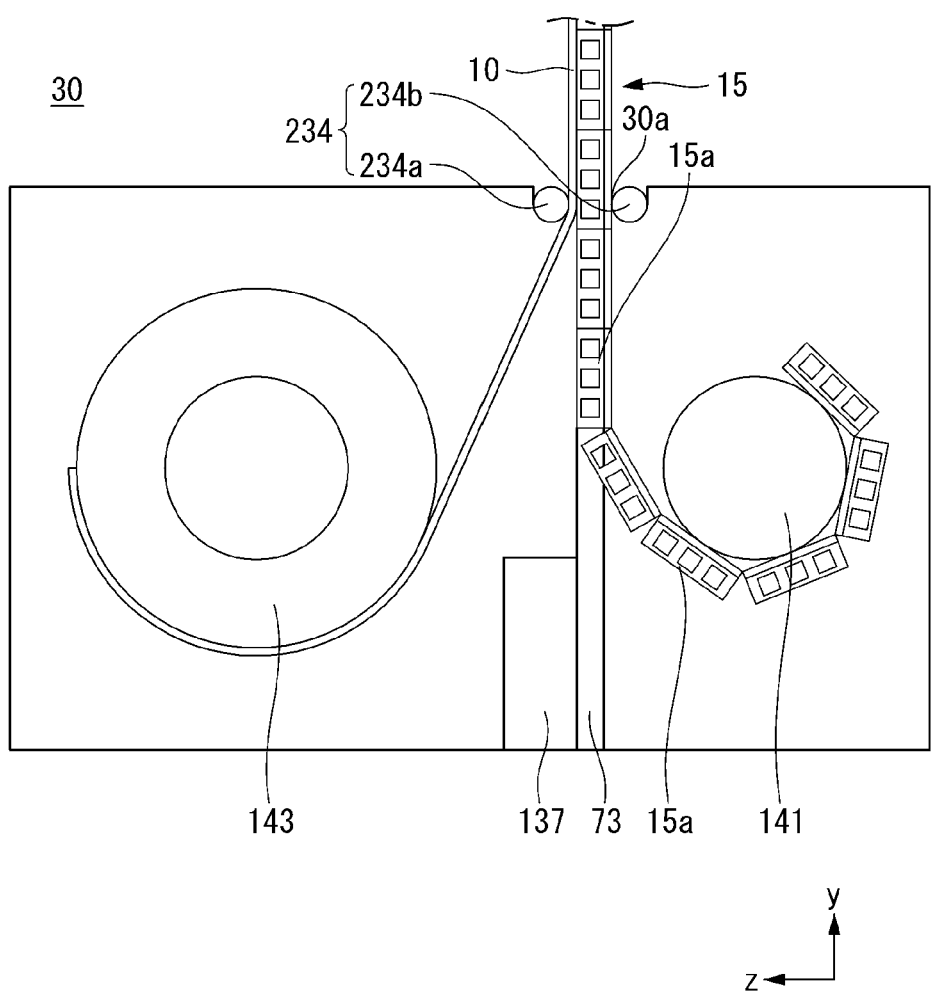

Referring FIG. 11, the display device according to the embodiment of the invention may further include an apron roller 141 as well as the panel roller 143 inside the housing 30. The panel roller 143 may be positioned in front of the support portion 73, and the apron roller 141 may be positioned in the rear of the support portion 73. Namely, the panel roller 143 and the apron roller 141 may face each other with the support portion 73 interposed between them.

The panel roller 143 may wind and unwind the display panel 10, and the apron roller 141 may wind and unwind the module cover 15. In this instance, because the display panel 10 and the module cover 15 are wound and unwound by different rollers, they may not be attached to each other by the adhesive layer.

Because the module cover 15 is thicker than the display panel 10, the module cover 15 may occupy a lot of space inside the housing 30. Thus, the motor assembly 137 may be positioned in front of the support portion 73 so that it does not interfere with the winding and the unwinding of the module cover 15. However, embodiments of the invention are not limited thereto. For example, the motor assembly 137 may be positioned in the rear of the support portion 73.

Because the display panel 10 and the module cover 15 are dividedly wound and unwound inside the housing 30, a winding/unwinding force of the panel roller 143 and the apron roller 141 may be greater than an adhesive force between the display panel 10 and the module cover 15.

The display device according to the embodiment of the invention can wind and unwind the display panel 10 and the module cover 15 using two rollers. Hence, the display panel 10 and the module cover 15 can be prevented from hanging because a smaller weight is applied to each roller.

Figure 12:
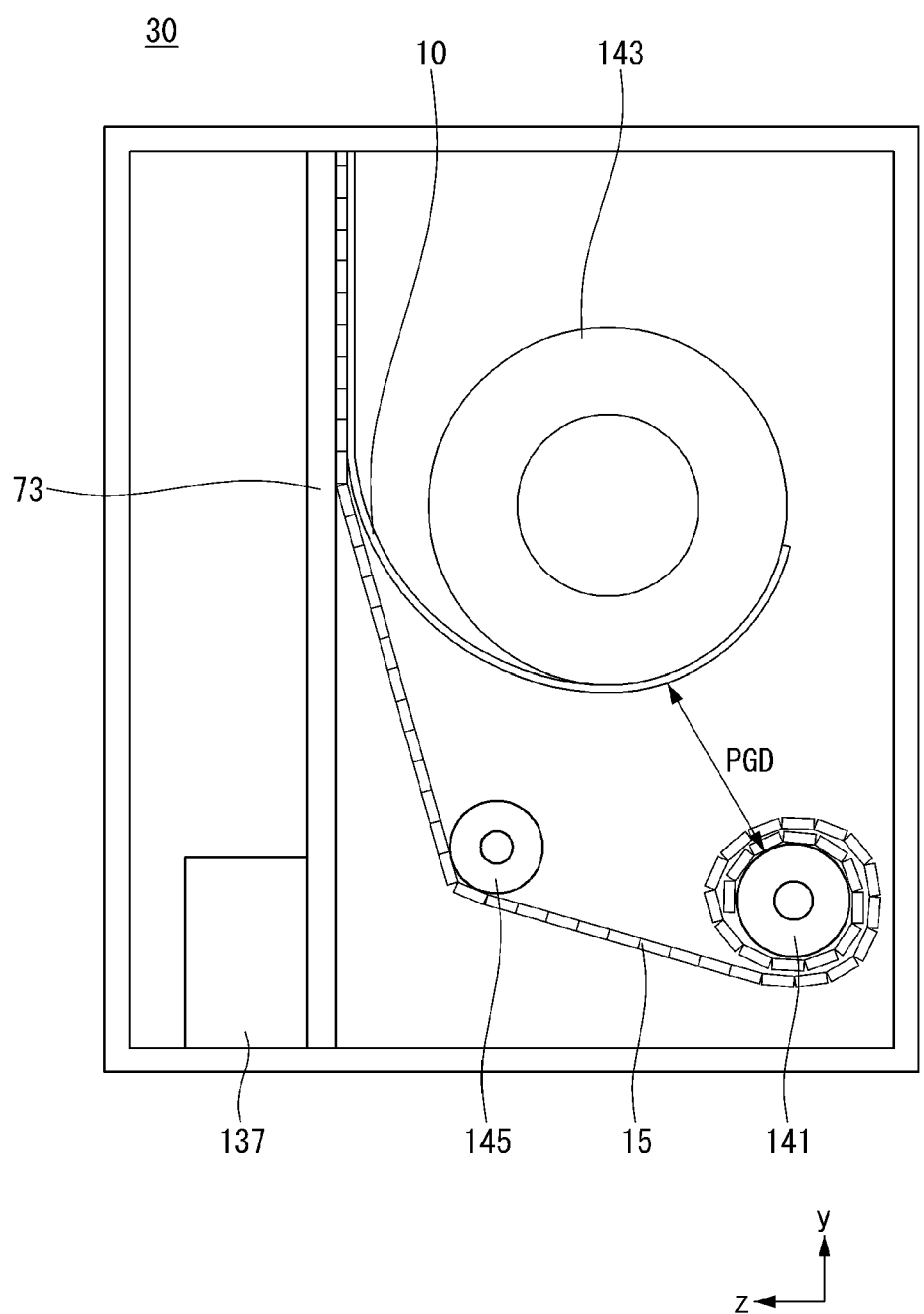

Referring to FIG. 12, in the display device according to the embodiment of the invention, the panel roller 143 and the apron roller 141 may be positioned on the same side. For example, the panel roller 143 and the apron roller 141 may be positioned in the rear of the support portion 73. However, embodiments of the invention are not limited thereto. For example, the panel roller 43 and the apron roller 141 may be positioned in front of the support portion 73.

The apron roller 141 may be positioned under the panel roller 143. Because the module cover 15 is relatively thick, a diameter of the apron roller 141 may greatly increase when the module cover 15 is changed from the second state to the first state. Thus, the apron roller 141 may be spaced apart from the panel roller 143 by a first distance PGD or more so that the apron roller 141 does not contact the panel roller 143. The first distance PGD may be more than a distance that the apron roller 141 cannot contact the panel roller 143 when the module cover 15 is in the first state.

A guide roller 145 may be positioned on a line on which the apron roller 141 is released. The guide roller 145 may guide a location of the module cover 15 so that the guide roller 145 does not contact the panel roller 143 when the module cover 15 is in one of the first state and the second state. The guide roller 145 may be positioned under the panel roller 143 so that the module cover 15 does not contact the panel roller 143.

In the display device according to the embodiment of the invention, the panel roller 143 and the apron roller 141 may be positioned not to contact each other at the same side (for example, the upper and lower sides). Thus, space can be saved more than when the panel roller 143 and the apron roller 141 are positioned at the different sides.

Figure 13:
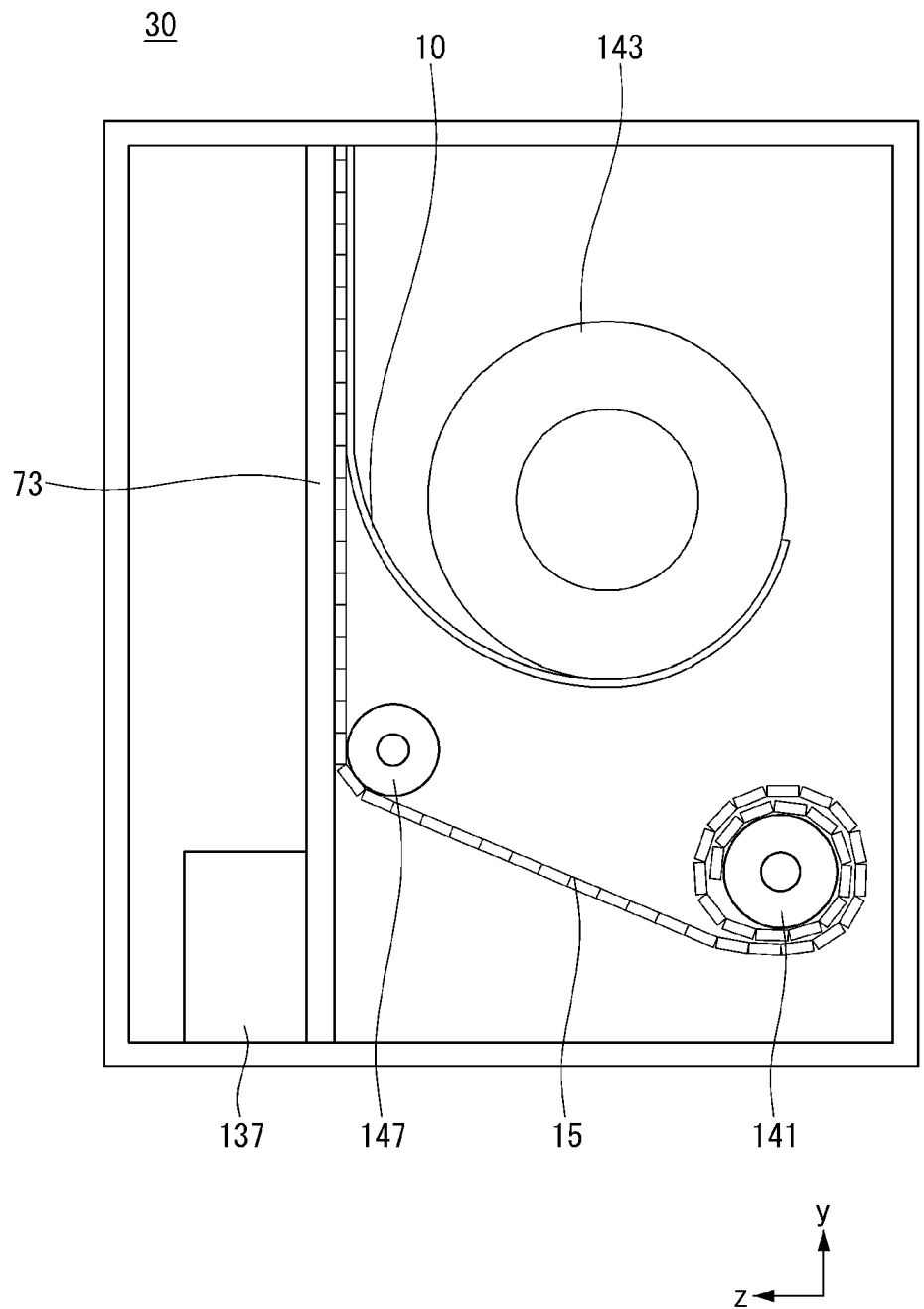

Referring to FIG. 13, in the display device according to the embodiment of the invention, a pressure roller 147 may be positioned instead of the guide roller 145. The pressure roller 147 may press the module cover 15 so that the module cover 15 contacts the support portion 73. Hence, the module cover 15 may not bend and may maintain a flat state. The pressure roller 147 may be positioned adjacent to the support portion 73 in the third direction so that the module cover 15 contacts the support portion 73. The pressure roller 147 may also function to guide the module cover 15 so that the module cover 15 and the panel roller 143 do not contact each other.

In the display device according to the embodiment of the invention, the pressure roller 147 can press the module cover 15 so that the module cover 15 contacts the support portion 73. Hence, the users can be more immersed in the flat display panel 10.

Figure 14:
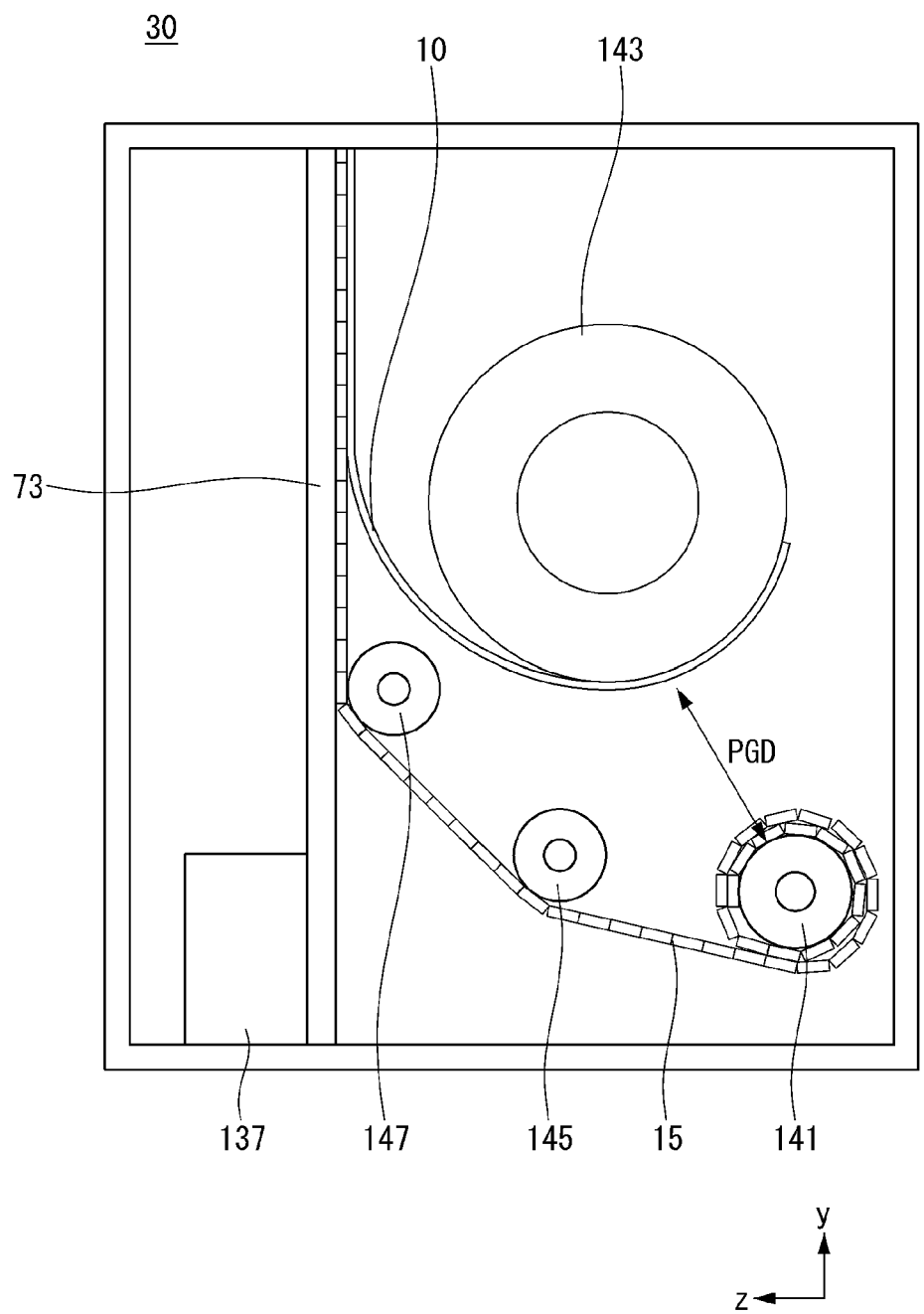

Referring to FIG. 14, in the display device according to the embodiment of the invention, both a guide roller 145 and a pressure roller 147 may be positioned. Thus, the module cover 15 may not contact the panel roller 143 and may contact the support portion 73. As a result, malfunction of the display device can be reduced, and the users can enjoy an image of the flat display panel 10.

Figure 15:
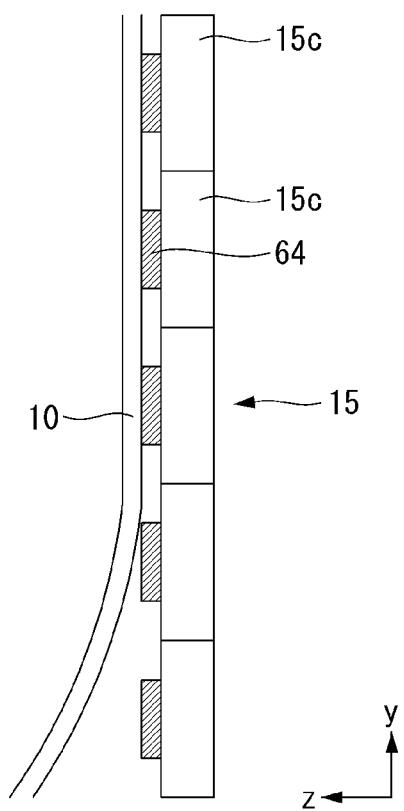

Referring to FIG. 15, in the display device according to the embodiment of the invention, a third module cover 15c positioned on both sides of the module cover 15 may be attached to the display panel 10.

The third module cover 15c and the display panel 10 may be attached by a magnet 64 positioned on at least one apron.

The magnet 64 may be attached to the apron using a double-sided tape. The magnet 64 may be positioned on each apron and attached to the display panel 10. The magnets 64 may be spaced apart from each other. Hence, the shape of the module cover 15 can be easily changed when the module cover 15 is wound or unwound by the roller.

The display panel 10 may be attached to the magnets 64. A surface of the display panel 10 contacting the magnets 64 may include Fe—Ni Invar alloy. Thus, the display panel 10 can be strongly attached to the magnets 64.

Because the display panel 10 and the module cover 15 are attached by the magnets 64 positioned only on both sides of the module cover 15, a large number of magnets 64 are not needed. As a result, the manufacturing cost of the display device can be reduced.

Figure 16:
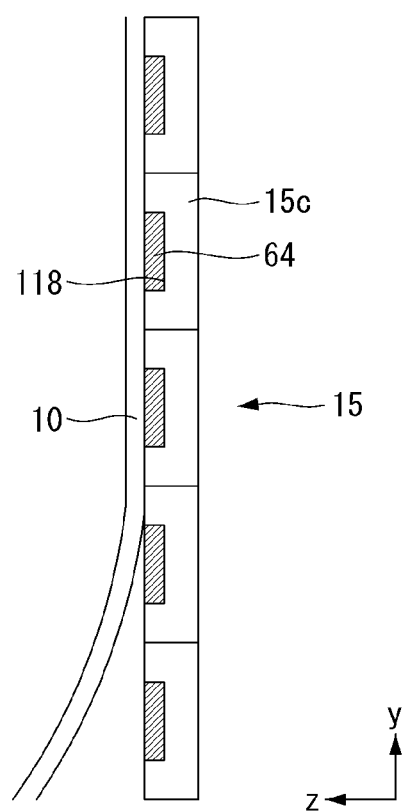

Referring to FIG. 16, the magnet 64 may be positioned inside a recess 118 of the third module cover 15c.

The recess 118 may be positioned on a surface of the third module cover 15c facing die display panel 10. The recess 118 may be positioned on each apron. Because the magnet 64 is positioned inside the recess 118, a surface of the apron contacting the display panel 10 may be flat. As a result, the thickness of the display device can be reduced, and the appearance of the display device can be neater.

Figure 17:
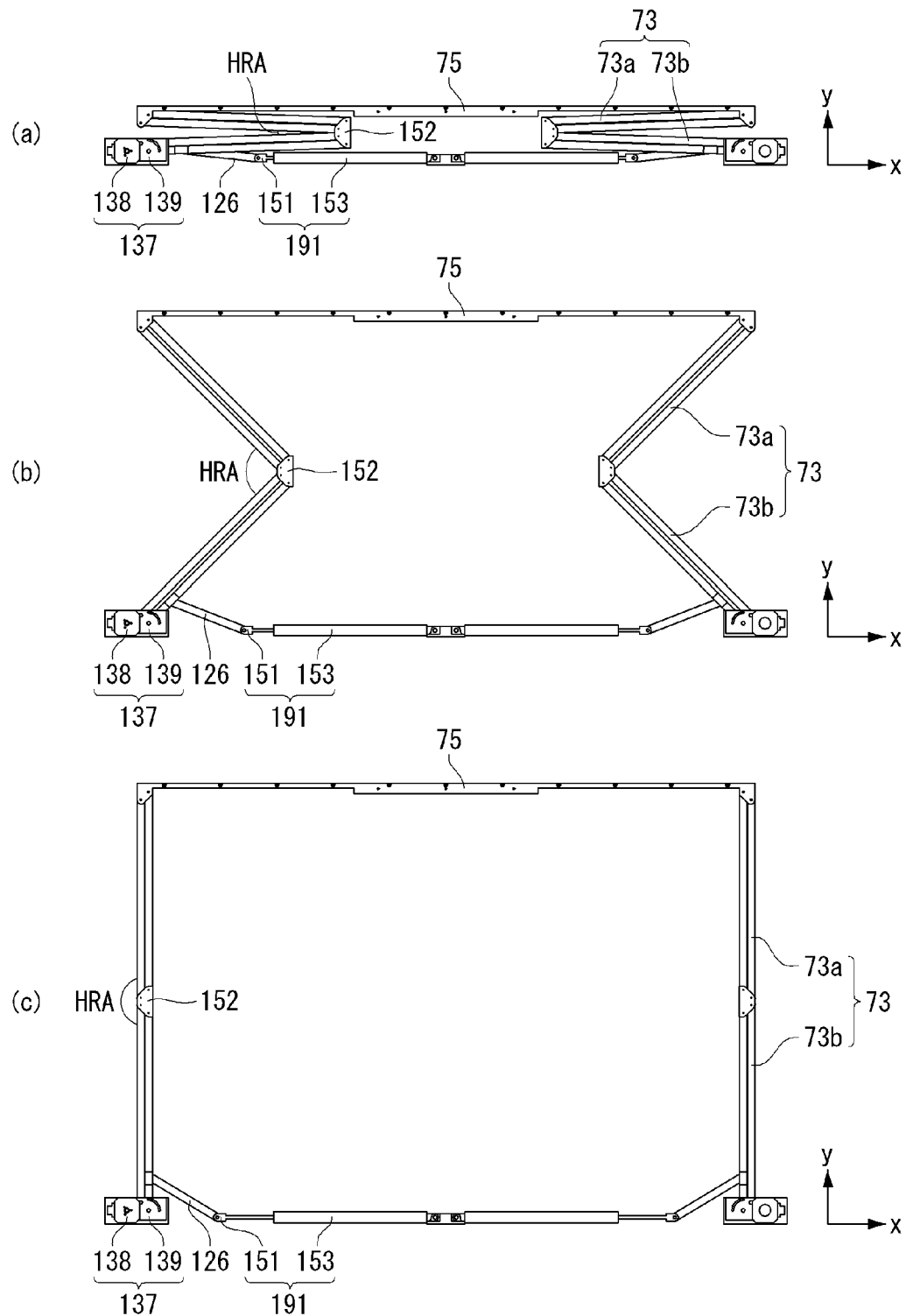

Referring to FIG. 17, as the display device according to the embodiment of the invention is changed from the first state to the second state, the upper bar 75 may move up. As the support portion 73 positioned at both ends of the upper bar 75 pushes the upper bar 75 up and down, the upper bar 75 may move up and down.

As shown in (a) of FIG. 17, when the display device is in the first state, an angle HRA between the upper link 73a and the lower link 73b may be very small. Hence, the upper bar 75 may not move up. Further, the display panel 10 and the module cover 15 may be wound on the panel roller 143.

As shown in (b) of FIG. 17, as the motor assembly 137 rotates, the angle HRA between the upper link 73a and the lower link 73b may increase. As the angle HRA between the upper link 73a and the lower link 73b increases, the upper bar 75 may move up. Hence, the display panel 10 and the module cover 15, that have been wound on the panel roller 143, may be gradually unwound.

As shown in (c) of FIG. 17, when the display device is in the second state, the upper link 73a and the lower link 73b may be positioned in parallel with each other in a straight line. Namely, the angle HRA between the upper link 73a and the lower link 73b may be 180 degrees. Thus, the upper bar 75 may move up to a highest height. Further, the display panel 10 and the module cover 15 may be unwound from the panel roller 143.

FIGS. 18 to 29 illustrate a display device according to an embodiment of the invention.

Figure 18A:
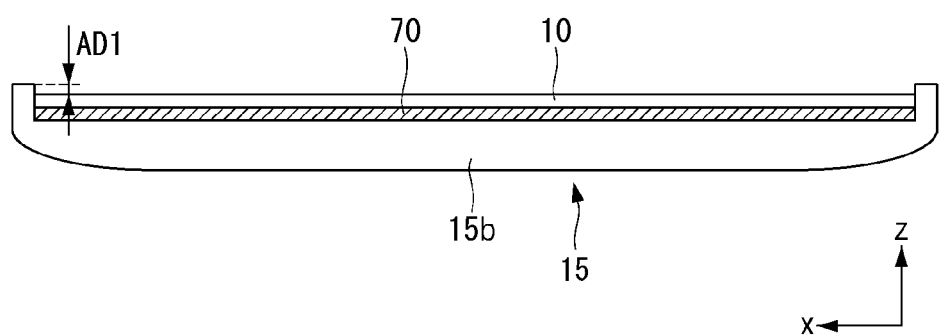
Figure 18B:
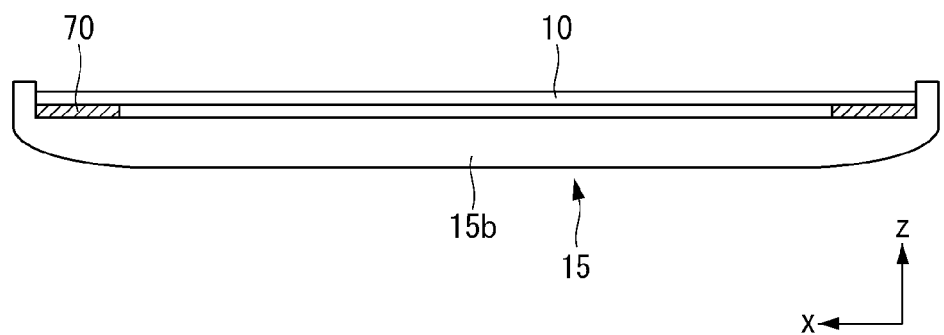

Referring to FIGS. 18A and 18B, in the display device according to the embodiment of the invention, both ends of the module cover 15 may bend in a forward direction. Namely, both ends of at least one apron 15b may bend in the forward direction.

The display panel 10 may be attached to an unbent portion of the module cover 15. A bending length of both ends of the module cover 15 in the forward direction may be greater than a sum of thicknesses of the display panel 10 and the adhesive layer 70. Namely, a bent portion of the module cover 15 may protrude more than the display panel 10 by a predetermined distance AD1 in the forward direction. Thus, the display panel 10 may not be exposed when viewed from the side.

As shown in FIG. 18A, the whole of the display panel 10 may be attached to the module cover 15. In this instance, an adhesive strength between the module cover 15 and the display panel 10 may be very strong. Hence, the module cover 15 and the display panel 10 may not be easily detached from each other.

As shown in FIG. 18B, both ends of the display panel 10 may be attached to the module cover 15. In this instance, the manufacturing cost can be reduced, compared to when the adhesive layer 70 is entirely attached between the display panel 10 and the module cover 15.

FIGS. 18A and 18B illustrate that the display panel 10 and the module cover 15 are attached to each other by the adhesive layer 70, by way of example. However, embodiments of the invention are not limited thereto. For example, the display panel 10 and the module cover 15 may be attached to each other by a magnet.

Figure 19:
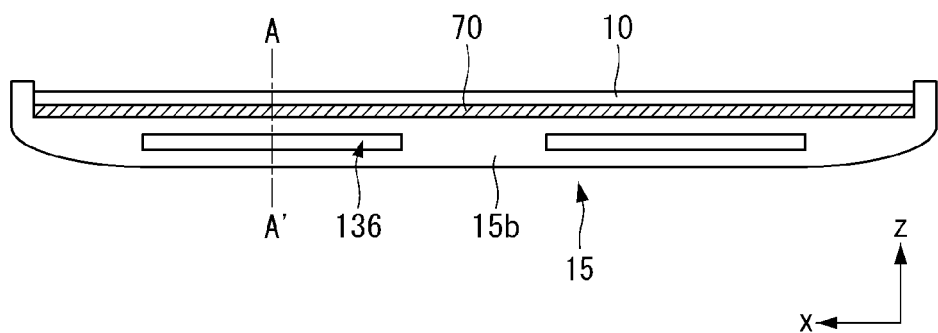
Figure 19:
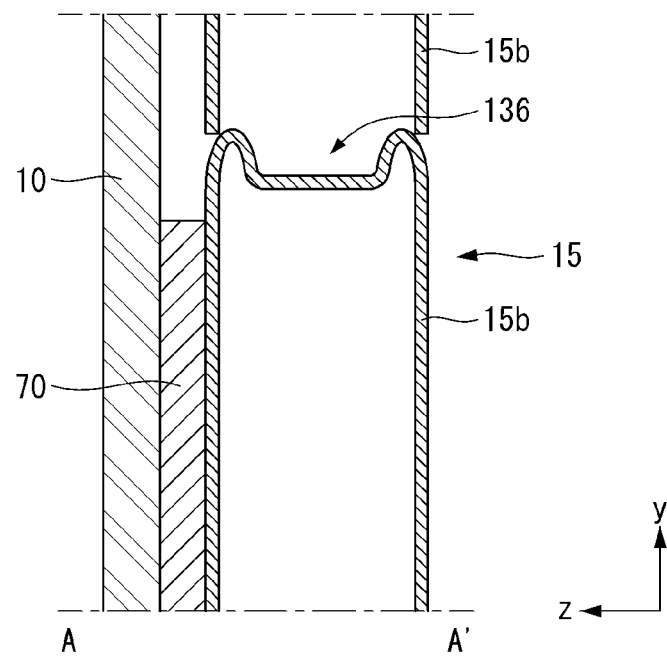

Referring to FIG. 19, in the display device according to the embodiment of the invention, a bead 136 may be formed on an upper surface of the apron 15b. The bead 136 may have a shape depressed to the inside of the apron 15b. At least one bead 136 may be formed on the apron 15b. For example, the beads 136 may be spaced apart from each other. The bead 136 can improve rigidity of the apron 15b. For example, the bead 136 can prevent the apron 15b from being deformed by an external impact.

Figure 20:
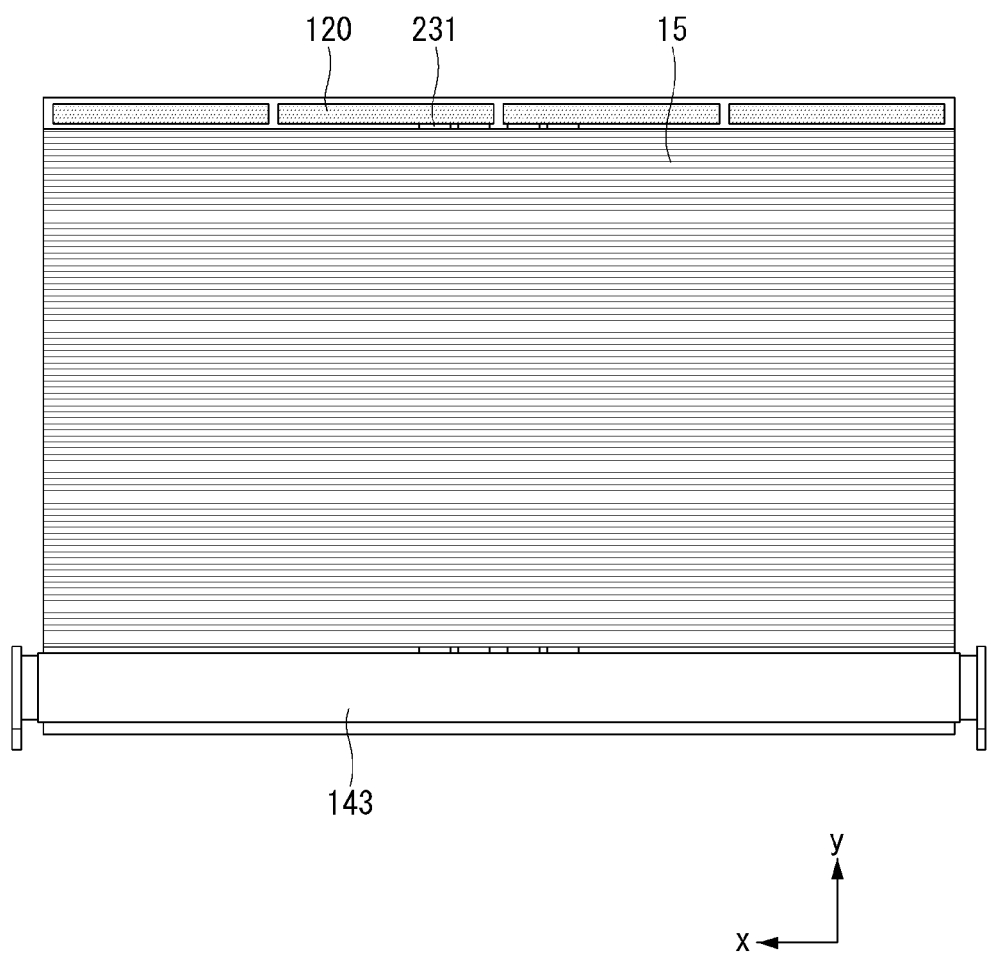

Referring to FIG. 20, in the display device according to the embodiment of the invention, the source PCB 120 may be positioned on an upper side of the module cover 15. Namely, when the module cover 15 is changed from the first state to the second state, a position of the source PCB 120 may vary depending on the movement of the module cover 15. Thus, a space for connection of the source PCB 120 and the timing controller board 105 mounted on the panel roller 143 may be required.

A formation space of a flexible flat cable (FFC) 231 may be required between the module cover 15 and the display panel positioned in front of the module cover 15. A detailed description thereof be given later. FIG. 20 illustrates that the FFC 231 is positioned in the center of the module cover 15 with respect to the first direction, by way of example. However, embodiments of the invention are not limited thereto. For example, the FFC 231 may be positioned at both ends of the module cover 15 with respect to the first direction.

Figure 21:
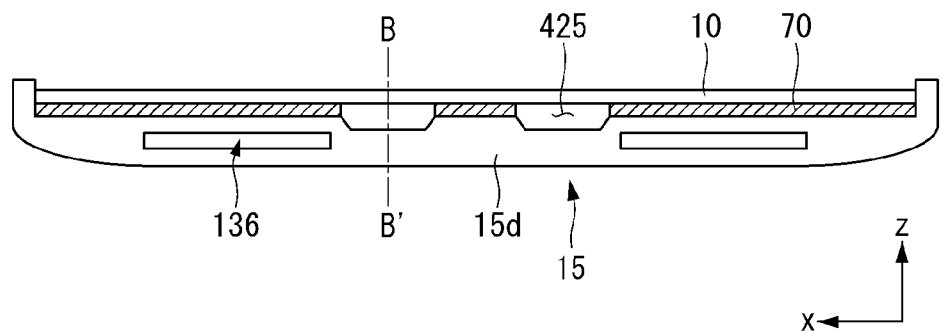
Figure 21:
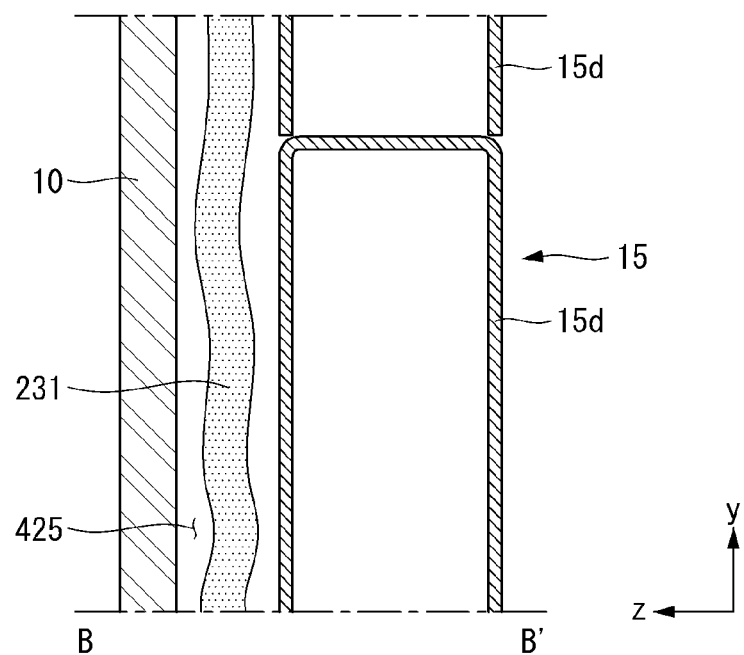

Referring to FIG. 21, the apron may include a depression 425 formed by depressing backward a front center portion of the apron with respect to the first direction. The depression 425 may be a portion where the FFC 231 is positioned. Namely, the depression 425 may form a space between the display panel 10 and the module cover 15. The depression 425 may improve the rigidity of the apron 15b.

The bead 136 may be positioned on the apron except a formation portion of the depression 425. The bead 136 may not be positioned in the formation portion of the depression 425 because a thickness of the apron in the third direction decreases. However, embodiments of the invention are not limited thereto. For example, the bead 136 may be positioned in the formation portion of the depression 425.

Figure 22:
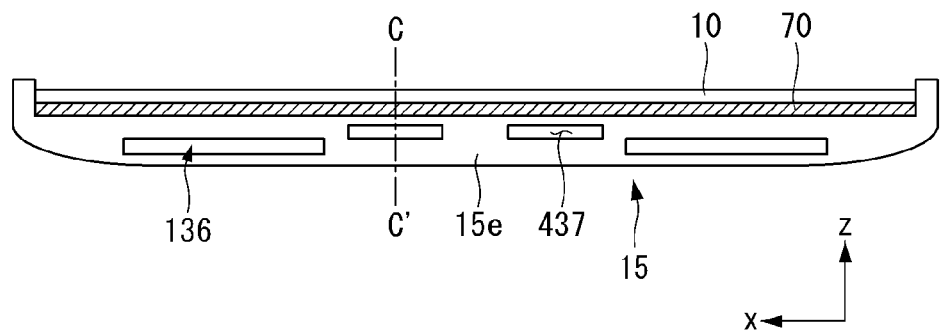
Figure 22:
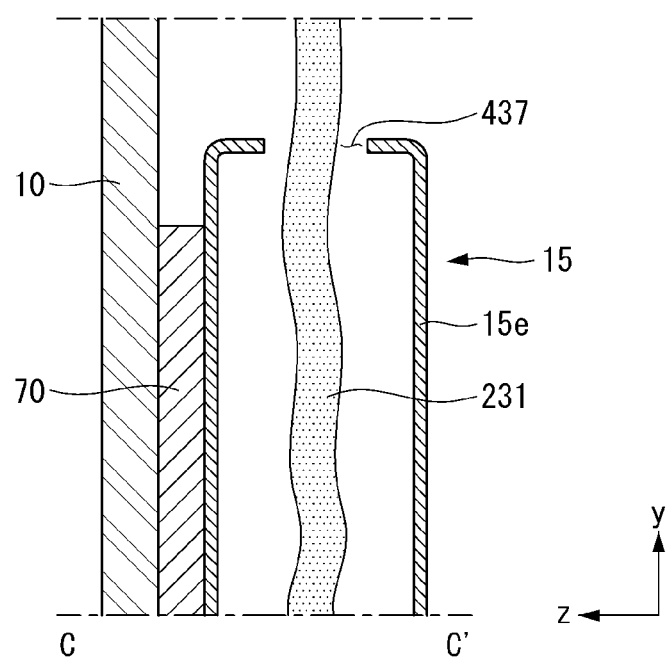

Referring to FIG. 22, the apron 15e may have a penetrating portion 437 positioned in the center with respect to the first direction. The penetrating portion 437 may penetrate a central portion of the apron 15e in the second direction. Namely, the penetrating portion 437 may be a hole positioned inside the apron 15e. The penetrating portion 437 may be a portion where the FFC 231 is positioned. Because the penetrating portion 437 is formed inside the apron 15e, the space can be saved compared to when the FFC 231 is positioned in the depression 425. Namely, the thickness of the display device can be reduced.

The bead 136 may be positioned on the apron 15e except a formation portion of the penetrating portion 437. The bead 136 may not be positioned in the formation portion of the penetrating portion 437 because the thickness of the apron 15e in the third direction decreases. However, embodiments of the invention are not limited thereto. For example, the bead 136 may be positioned in the formation portion of the penetrating portion 437.

Figure 23:
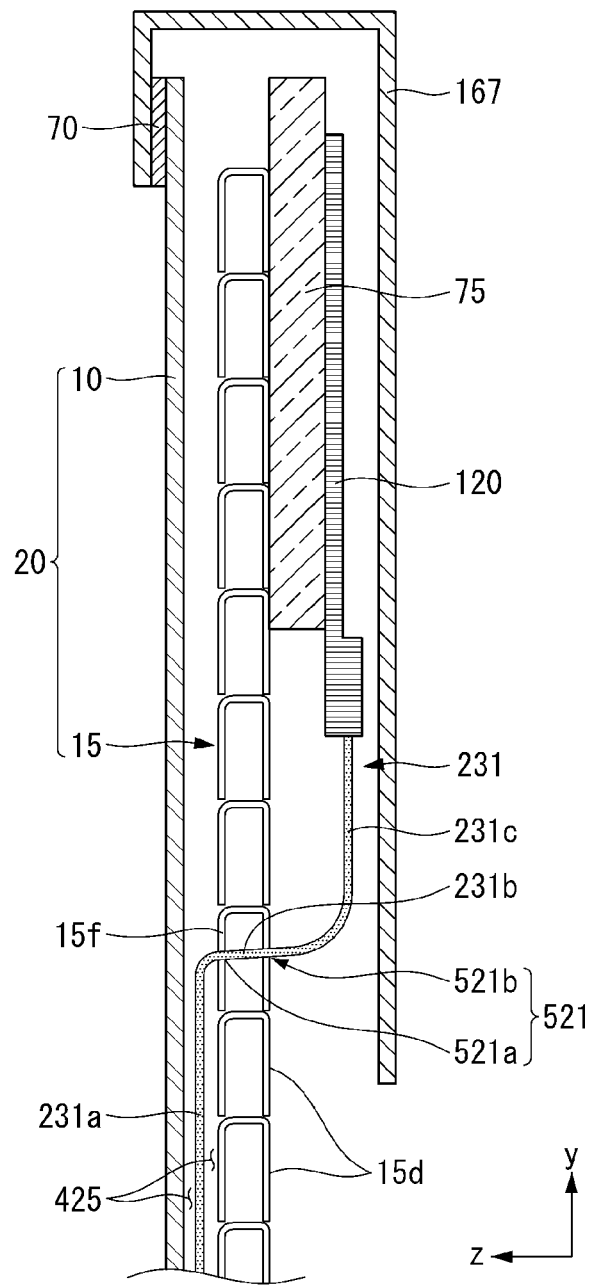

Referring to FIG. 23, in the display device according to the embodiment of the invention, the top case 167 may shield the source PCB 120 and the upper bar 75 as well as the display panel 10 and the module cover 15. Thus, the user can feel that the appearance of the display device is neat because the source PCB 120 is not exposed to the outside.

One surface of the upper bar 75 may be coupled to the back surface of the module cover 15, and the other surface of the upper bar 75 may be coupled to the source PCB 120. The upper bar 75 may be fixed to the module cover 15 and may support the source PCB 120.

Figure 29:
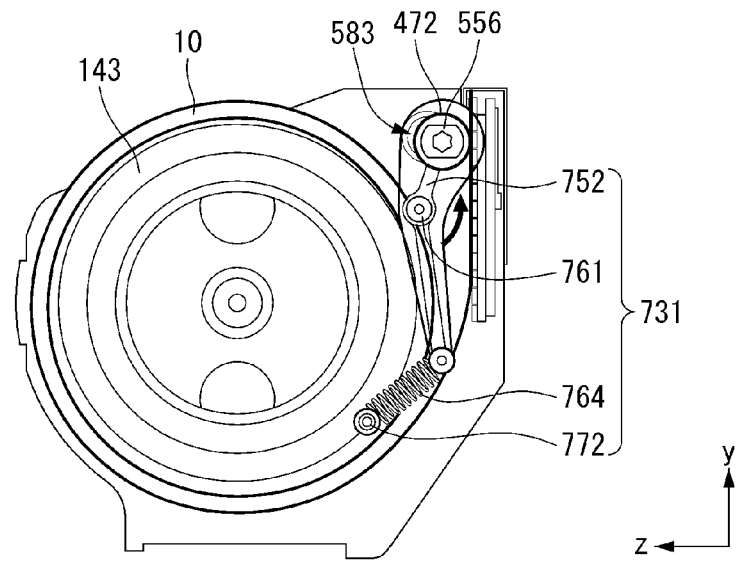
Figure 29:
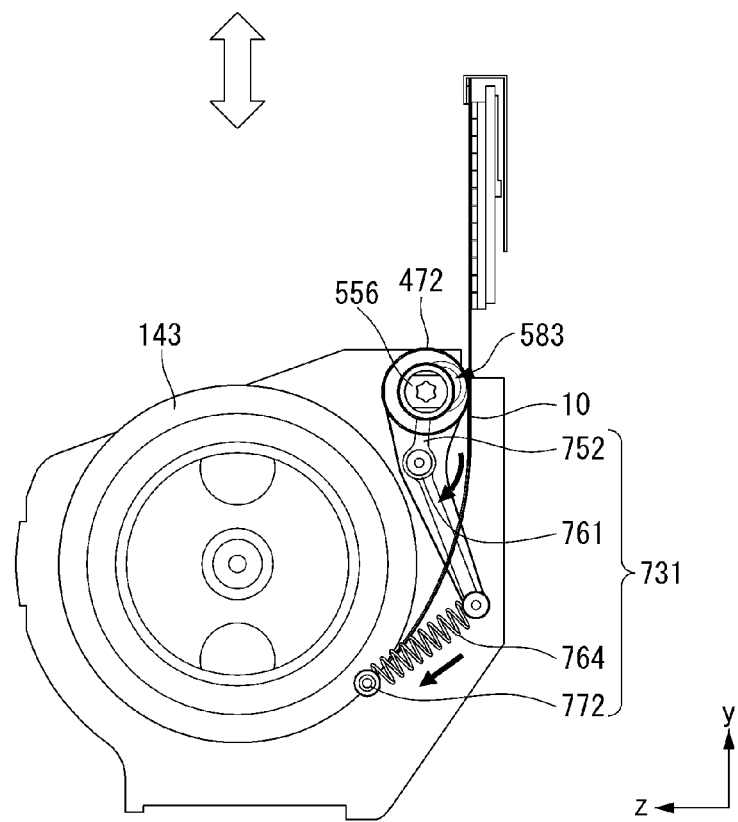

A lower end of the FFC 231 may be connected to the timing controller board 105 (see FIG. 29) inside the panel roller 143 (see FIG. 29). The FFC 231 and the display unit 20 may be wound on and unwound from the panel roller 143.

A portion of the FFC 231 may be positioned between the display panel 10 and the module cover 15. The portion of the FFC 231 between the display panel 10 and the module cover 15 may be referred to as a first portion 231a. The first portion 231a may be positioned in a depression 425, in which a plurality of aprons 15d is formed. Or, the first portion 231a may be accommodated in the depression 425, in which the plurality of aprons 15d is formed.

A portion of the FFC 231 may penetrate an apron 15f. The portion of the FFC 231 penetrating the apron 15f may be referred to as a second portion 231b. The apron 15f may include a first hole 521a formed at a front surface and a second hole 521b formed at a back surface. The first hole 521a and the second hole 521b may communicate with each other to form one hole 521. The hole 521 may penetrate the apron 15f in the third direction. The second portion 231b may penetrate the hole 521. The hole 521 may be referred to as a connection hole 521.

An upper end of the FFC 231 may be electrically connected to the source PCB 120. A portion of the FFC 231 may be positioned on a back surface of the module cover 15. The portion of the FFC 231 on the back surface of the module cover 15 may be referred to as a third portion 211c. The third portion 231c may be electrically connected to the source PCB 120.

The third portion 231c may be shielded by the top case 167. Hence, the third portion 231c may not be exposed to the outside.

A portion of the FFC 231 exposed to the hack surface of the module cover 15 may be shielded by the top case 167. Thus, only the top case 167, the display panel 10, and the module cover 15 may be exposed when viewed from the outside.

Figure 24:
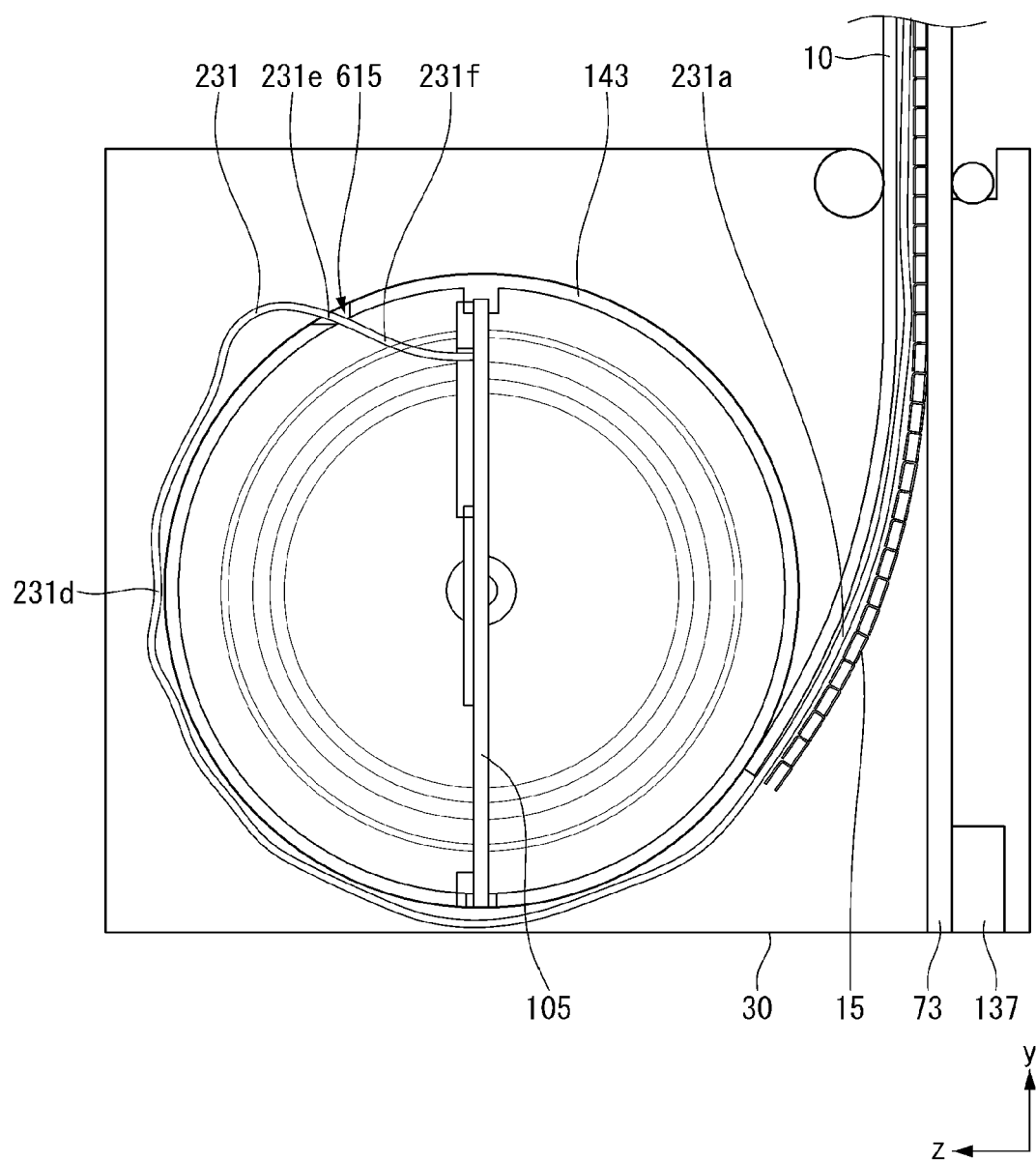

Referring to FIG. 24, in the display device according to the embodiment of the invention, the FFC 231 may be connected to the timing controller board 105 mounted on the panel roller 143. A through hole 615 may be positioned in the panel roller 143 so that the FFC 231 is connected to the timing controller board 105 through the panel roller 143. The through hole 615 may be positioned on one side of the panel roller 143 and may penetrate an outer peripheral portion of the panel roller 143. The FFC 231 may be connected to one side of the timing controller board 105 through the through hole 615.

In the display device according to the embodiment of the invention, even when the FFC 231 is positioned on the outer periphery of the panel roller 143, the connection between the FFC 231 and the timing controller board 105 can be maintained by the through hole 615. Hence, the FFC 231 can rotate together with the panel roller 143 and cannot be twisted.

A portion of the FFC 231 may be wound on the panel roller 143. The portion of the FFC 231 wound on the panel roller 143 may be referred to as a fourth portion 231*d*. The fourth portion 231*d* may contact an outer peripheral surface of the panel roller 143.

A portion of the FFC 231 may penetrate a through hole 615. The portion of the FFC 231 penetrating the through hole 615 may be referred to as a Fifth portion 231*e*.

The lower end of the FFC 231 may be electrically connected to the timing controller board 105. A portion of the FFC 231 may be positioned inside the panel roller 143. The portion of the FFC 231 positioned inside the panel roller 143 may be referred to as a sixth portion 231*f*. The sixth portion 231*f* tray be electrically connected to the timing controller board 105.

Figure 25:
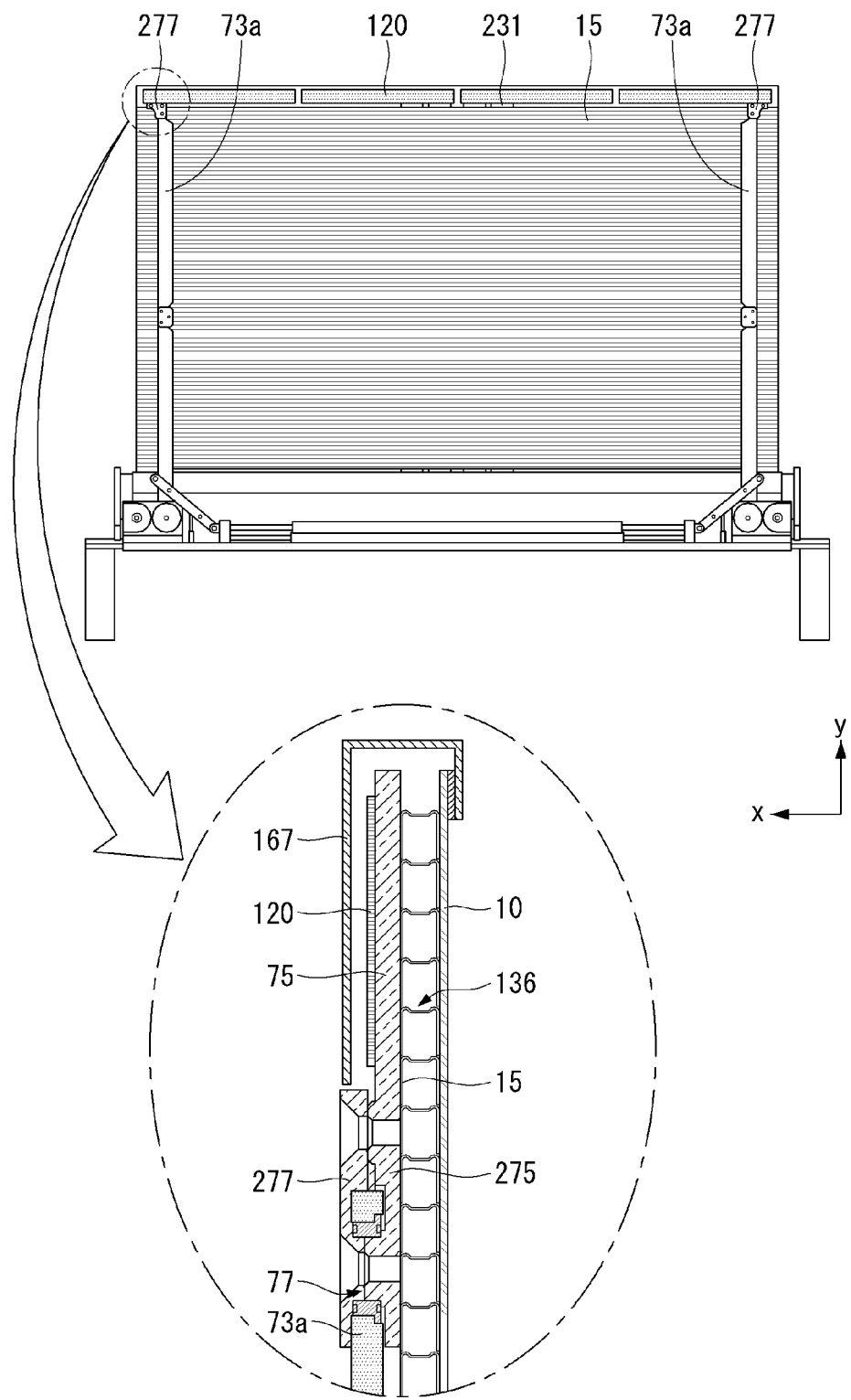

Referring to FIG. 25, the supports 73 may be connected to bath ends of the upper bar 75. A coupling hole 77 positioned in the upper link 73*a* of the support portion 73 may be coupled with a link bracket 277 coupled to a connecting portion 275 of the upper bar 75. The link bracket 277 may be positioned outside the top case 167. The link bracket 277 may couple the upper link 73*a* to the connecting portion 275 through at least one screw.

Because the support portion 73 is positioned on the back surface of the module cover 15, the support portion 73 may not be conspicuous to the user. Thus, the support portion 73 may not be a problem when the user views the display screen.

The display device according to the embodiment of the invention can greatly save space because all of the module cover 15, the source PCB 120, and the support portion 73 are connected to the upper bar 75.

Figure 26:
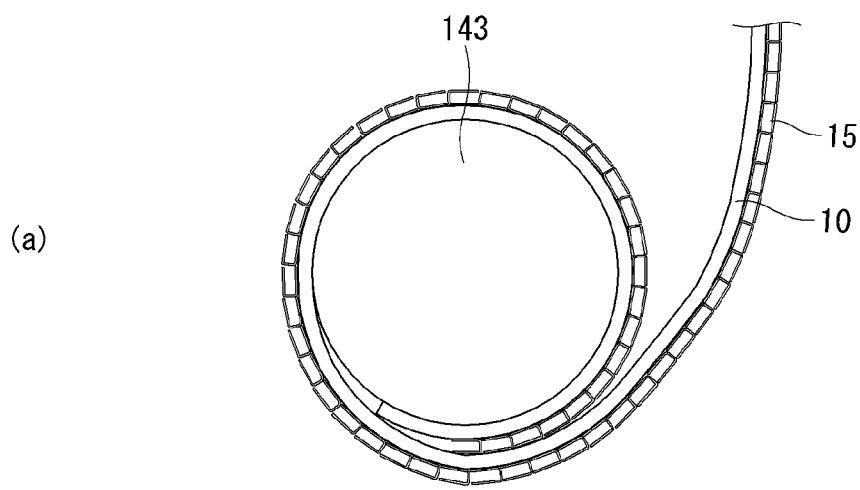
Figure 26:
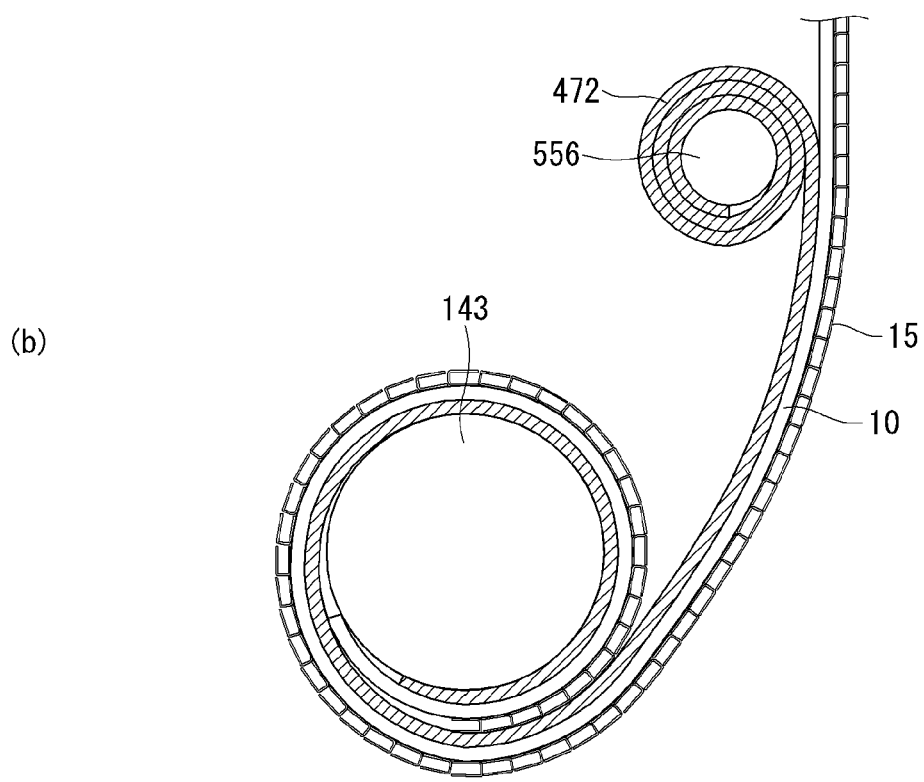

Referring to FIG. 26, the display device according to the embodiment of the invention may further include an auxiliary roller 556 as well as the panel roller 143. One end of the auxiliary roller 556 may be connected to a protective sheet 472. One end of the protective sheet 472 may be connected to the auxiliary roller 556, and the other end may be connected to one end of the display panel 10. The auxiliary roller 556 may wind or unwind the protective sheet 472 such that the protective sheet 472 is in a wound state or an unwound state. For example, the protective sheet 472 may include a nonwoven fabric.

The auxiliary roller 556 may be positioned adjacent to a portion where the panel roller 143 rotates to wind and unwind. The auxiliary roller 556 may rotate in the direction opposite to the panel roller 143. Namely, when the panel roller 143 unwinds the display panel 10, the auxiliary roller 556 may wind the protective sheet 472. Further, when the panel roller 143 winds the display panel 10, the auxiliary roller 556 may unwind the protective sheet 472.

As shown in (a) of FIG. 26, in a display device according to a related art, as a panel roller 143 rotates to wind and unwind, a module cover 15 and a display panel 10 were in contact with each other. As a result, a crack may be formed.

On the other hand, as shown in (b) of FIG. 26, the display device according to the embodiment of the invention may be configured such that the display panel 10 is wound, and at the same time the protective sheet 472 of the auxiliary roller 556 is unwound. Thus, the protective sheet 472 can prevent the module cover 15 and the display panel 10 from being in contact with each other. Namely, a crack may not be formed on the display panel 10. The user can enjoy a clean screen because the protective sheet 472 protects the display panel 10.

Figure 27:
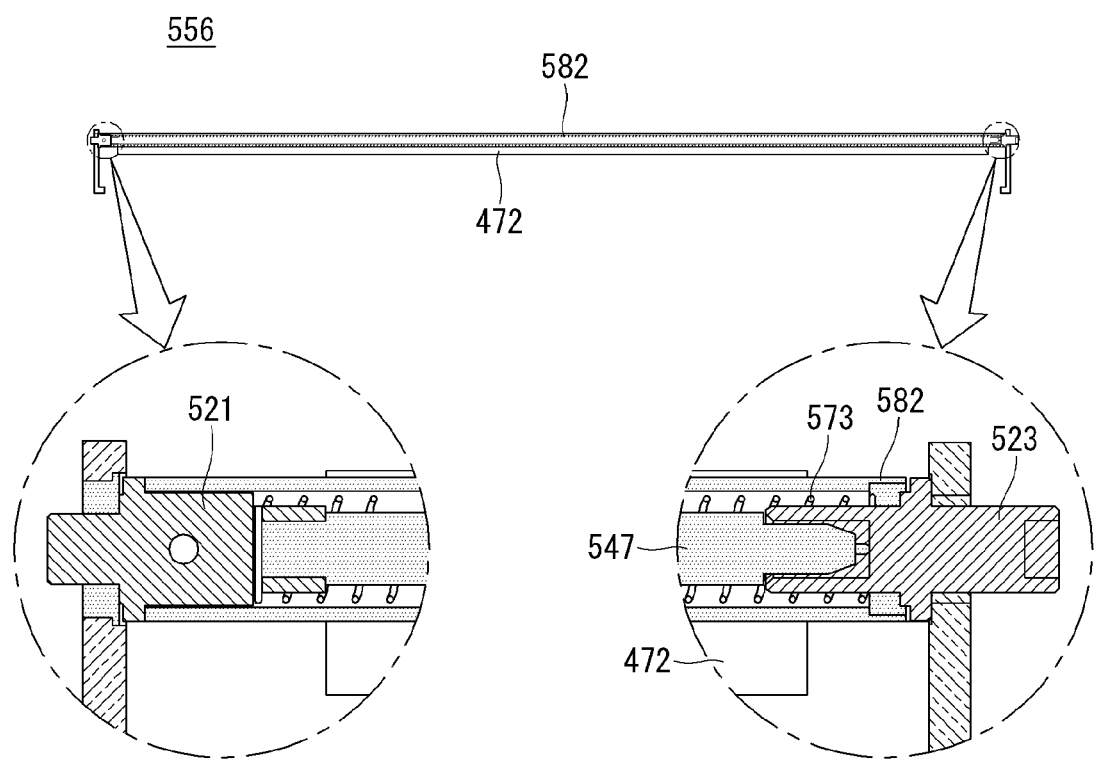

Referring to FIG. 27, the auxiliary roller 556 may include a fixed cap 521, a rotating cap 523, a shaft 547, a coil spring 573, and a roller cover 582.

The fixed cap 521 may be positioned at one end of the auxiliary roller 556. The fixed cap 521 may be positioned at a central axis of the auxiliary roller 556. One end of the coil spring 573 may be coupled to the fixed cap 521. Even when the roller cover 582 rotates, the fixed cap 521 gray not rotate. Namely, the fixed cap 521 may be fixed.

The rotating cap 523 may be positioned at the other end of the auxiliary roller 556. The rotating cap 523 may be positioned at the central axis of the auxiliary roller 556. The other end of the coil spring 573 may be coupled to the rotating cap 323. When the roller cover 582 rotates, the rotating cap 523 may rotate at the same time as the roller cover 582.

When the roller cover 582 rotates, the fixed cap 521 on one side of the roller cover 582 may not rotate, and only the rotating cap 523 on the other side of the roller cover 582 may rotate together with the roller cover 582. Hence, the coil spring 573 may be wound. Namely, one end of the coil spring 573 connected to the fixed cap 521 may be fixed, and the other end of the coil spring 573 connected to the rotating cap 523 may be wound while rotating. The coil spring 573 may store energy while being wound.

As a result, as the protective sheet 472 is unwound, a force of the auxiliary roller 556 to rewind the protective sheet 472 may increase. Namely, when the display panel is unwound, the protective sheet 472 of the auxiliary roller 556 may be automatically wound. Further, as the protective sheet 472 is wound, a force of the auxiliary roller 556 to unwind again the protective sheet 472 may increase. Namely, when the display panel is wound, the protective sheet 472 of the auxiliary roller 556 may be automatically unwound.

The shaft 547 may be the central axis of the auxiliary roller 556. The shaft 547 may be connected to the fixed cap 521. The shaft 547 may be inserted into the coil spring 573. Hence, the shaft 547 can prevent the coil spring 573 from moving when the coil spring 573 is wound.

The roller cover 582 may constitute the outer periphery of the auxiliary roller 556. The roller cover 582 may shield the fixed cap 521, the rotating cap 523, the shaft 547, and the coil spring 573. The roller cover 582 may be connected to one end of the protective sheet 472. Namely, the protective sheet 472 may be wound around the roller cover 582.

Because the coil spring 573 of the auxiliary roller 556 stores energy, the display device according to the embodiment of the invention can easily wind and unwind the protective sheet 472.

Figure 28:
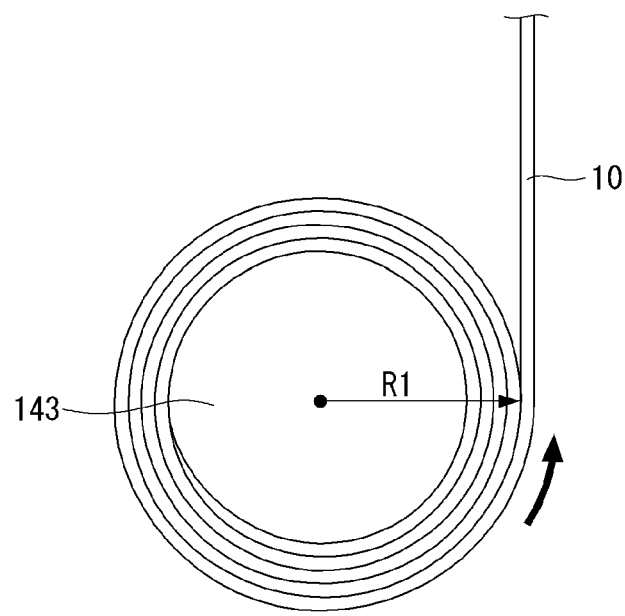
Figure 28:
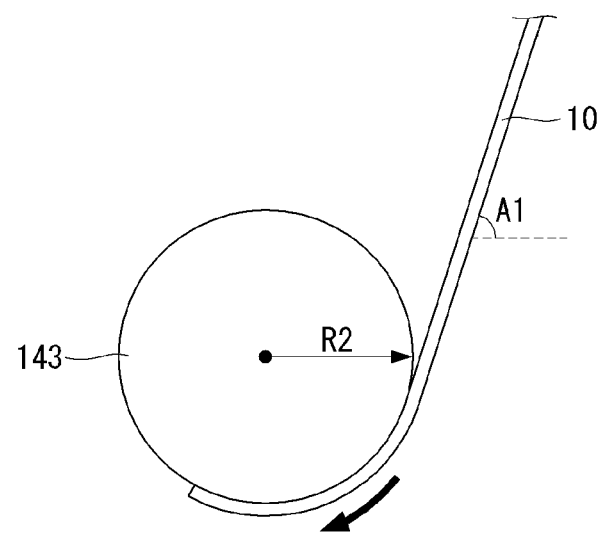

Referring to FIG. 28, when the display panel 10, that has been wound around the panel roller 143, is unwound, a total radius R1 may increase because a diameter of the display panel 10 is added to a diameter of the panel roller 14. Hence, the display panel 10 may move in a straight line at a portion where the display panel 10 moves up and down to the outside of the housing.

On the contrary, when the display panel 10, that has been unwound from the panel roller 143, is wound, only the diameter of the panel roller 143 may constitute a total radius R2. Therefore, the total radius R2 may be less than the total radius R1 when the display panel 10 is wound. Hence, the display panel 10 may slantly move at a predetermined angle A1 at a portion where the display panel 10 moves up and down to the outside of the housing. In this instance, the display panel 10 exposed to the outside may be inclined to one side or may unstably move up and down.

Referring to FIG. 29, in the display device according to the embodiment of the invention, a guide assembly 731 may be coupled to the auxiliary roller 556.

The auxiliary roller 556 may push the display panel 10 so as to prevent the display panel 10 from being inclined when the display panel 10 is wound and unwound, using the guide assembly 731. The guide assembly 731 may move depending on a change in the diameter of the display panel 10 and thus guide the display panel 10 to maintain a straight line in a portion contacting the auxiliary roller 556. A position of the auxiliary roller 556 may change as the display panel 10 changes from the first state to the second state. The auxiliary roller 556 may is we on a rail 583 formed inside the housing 30 and push the display panel 10.

The guide assembly 731 may include a guide arm 752, a pin bolt 761, a tension spring 764, and a supporter 772. One end of the guide arm 75 may be connected to the auxiliary roller 556, and the other end be connected to the tension spring 764. An extending direction of the guide arm 752 may change with respect to the pin bolt 761. Namely, the guide arm 752 may be inclined in different directions with respect to the pin bolt 761. When the auxiliary roller 556 moves on the rail 583, an angle of the guide arm 752 with respect to the pin bolt 761 may be changed. Namely, the guide arm 752 may rotate around the pin bolt 761 fixed to the housing 30.

One end of the tension spring 764 may be connected to the guide arm 762, and the other end may be connected to the supporter 772. Because the supporter 772 is fixed to the housing 30, the tension spring 764 may be tensioned or compressed when the guide arm 762 rotates. The guide arm 762 may be subjected to a force of rotation in a first direction (for example, a clockwise direction) by the tension spring 764. Namely, the auxiliary roller 556 may receive a force of moving in the direction of the display panel 10. Hence, the auxiliary roller 556 may continuously push the display panel 10 so that the display panel 10 is not inclined.

When the display panel 10 changes from the first state to the second state, the auxiliary roller 556 may wind the protective sheet 472. Thus, a diameter of the a auxiliary roller 556 may increase, and the center of the auxiliary roller 556 may move in a direction away from the front surface of the display panel 10 on the rail 583.

Hence, the guide arm 762 may rotate in a second direction opposite to the first direction. For example, the guide arm 762 may rotate in a counterclockwise direction. As a result, the tension spring 764 may be gradually extended, and the auxiliary roller 556 may push the display panel 10. Namely, as the display panel 10 changes from the first state to the second state, the auxiliary roller 556 may push the display panel 10 more strongly.

When the display panel 10 changes from the second state to the first state, it can operate in reverse to the above. Namely, the auxiliary roller 556 may be close to the front surface of the display panel 10. As described above, because the auxiliary roller 556 continuously pushes the display panel 10 by the guide assembly 731, the display panel 10 may not be inclined to one side.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a housing;
    a panel roller elongated inside the housing;
    an auxiliary roller positioned inside the housing, opposite to the panel roller, and elongated along the panel roller;
    a display unit including a display panel and a module cover, the display unit wound around the panel roller or unwound from the panel roller;
    a motor assembly;
    an upper bar coupled to an upper part of the display unit;
    at least one support portion having one side coupled to an end of the upper bar and having another side coupled to the motor assembly, the at least one support portion moving the upper bar up and down with an operation of the motor assembly;
    a protective sheet positioned inside the housing and being wound around the auxiliary roller when the display unit is unwound from the panel roller, the protective sheet being wound around the panel roller with the display unit when the display unit is wound around the panel roller; and
    a guide assembly connected to the auxiliary roller and configured to support the display unit to prevent the display panel from being inclined, when the display unit wound around the panel roller or unwound from the panel roller.

2. The display device of claim 1, wherein one end of the protective sheet is connected to the auxiliary roller, and another end of the protective sheet is connected to one end of the display panel.

3. The display device of claim 1, wherein the protective sheet includes a nonwoven fabric.

4. The display device of claim 1, wherein when the display panel is wound around the panel roller or unwound from the panel roller, a position of the auxiliary roller within the housing changes.

5. The display device of claim 4, wherein a front surface of the display panel is closer to the auxiliary roller when the display panel is wound around the panel roller.

6. The display device of claim 5, further comprising a rail inside the housing, wherein the auxiliary roller is movable along the rail.

7. The display device of claim 1, wherein the guide assembly guides the auxiliary roller to move towards the front surface of the display panel when the display panel is wound around the panel roller.

8. The display device of claim 6, wherein the guide assembly includes:
- a guide arm of which one end is connected to the auxiliary roller; and
- a tension spring of which one end is connected to another end of the guide arm.

9. The display device of claim 8, wherein as the auxiliary roller moves, the guide arm rotates.

10. The display device of claim 9, wherein as the auxiliary roller moves away from the front surface of the display panel, the guide arm rotates in a counterclockwise direction.

11. The display device of claim 8, wherein as the guide arm rotates, a length of the tension spring changes.

12. The display device of claim 11, wherein as the auxiliary roller moves away from the front surface of the display panel, the length of the tension spring increases.

13. The display device of claim 11, wherein as the auxiliary roller moves closer to the front surface of the display panel, the length of the tension spring decreases.

14. The display device of claim 8, wherein the guide assembly further includes a pin bolt that is positioned in a center of the guide arm and fixes the guide arm to the housing.

15. The display device of claim 14, wherein an extending direction of the guide arm changes with respect to the pin bolt.

16. The display device of claim 14, wherein when the display panel is unwound from the panel roller, the guide arm rotates around the pin bolt.

17. The display device of claim 8, wherein the guide assembly further includes a supporter that is connected to the another end of the tension spring and is fixed to the housing.

18. The display device of claim 8, wherein the tension spring includes a coil spring.

19. The display device of claim 18, wherein the guide assembly further includes:
- a fixed cap fixed to one end of the auxiliary roller and an one end of the coil spring; and
- a rotating cap positioned at another end of the auxiliary roller and being rotatable, the rotating cap connected to an another end of the coil spring.

\* \* \* \* \*